(12) United States Patent
Kim

(10) Patent No.: US 11,176,976 B2
(45) Date of Patent: Nov. 16, 2021

(54) SYSTEMS FOR PERFORMING A READ-MODIFY-WRITE OPERATION

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/989,320

(22) Filed: Aug. 10, 2020

(65) Prior Publication Data

US 2021/0327479 A1 Oct. 21, 2021

(30) Foreign Application Priority Data

Apr. 16, 2020 (KR) .................. 10-2020-0046329

(51) Int. Cl.
*G11C 7/22* (2006.01)
*G06F 11/10* (2006.01)
*G11C 7/10* (2006.01)

(52) U.S. Cl.
CPC .......... *G11C 7/222* (2013.01); *G06F 11/1068* (2013.01); *G11C 7/1069* (2013.01); *G11C 7/1096* (2013.01)

(58) Field of Classification Search
None
See application file for complete search history.

(56) References Cited

U.S. PATENT DOCUMENTS 11,031,064 B1 * 6/2021 Kim .................. G11C 11/4082

FOREIGN PATENT DOCUMENTS

KR 1020140126225 A 10/2014

* cited by examiner

*Primary Examiner* — James G Norman
(74) *Attorney, Agent, or Firm* — William Park & Associates Ltd.

(57) ABSTRACT

A semiconductor memory device includes a read/write control circuit and an error correction circuit. The read/write control circuit generates an internal write signal after generating an internal read signal from one of a plurality of shifted signals which are generated by shifting a read-modify-write command according to a frequency of a clock signal. The error correction circuit corrects an error included in internal data by performing a logical operation of read data generated by the internal read signal and the internal data to generate write data. The internal read signal is enabled by a write set signal during the read-modify-write operation.

25 Claims, 25 Drawing Sheets

FIG. 4

| FREQUENCY PERIOD | | F_INF<1> | F_INF<2> | F_INF<3> | F_INF<4> | F_INF<5> | F_INF<6> | F_INF<7> | F_INF<8> | F_INF<9> |
|---|---|---|---|---|---|---|---|---|---|---|
| HIGH FREQUENCY | 7200Mbps ~ 7599Mbps | H | L | L | L | L | L | L | L | L |
| | 6800Mbps ~ 7199Mbps | L | H | L | L | L | L | L | L | L |
| | 6400Mbps ~ 6799Mbps | L | L | H | L | L | L | L | L | L |
| NORMAL FREQUENCY | 6000Mbps ~ 6399Mbps | L | L | L | H | L | L | L | L | L |
| | 5600Mbps ~ 5999Mbps | L | L | L | L | H | L | L | L | L |
| | 5200Mbps ~ 5599Mbps | L | L | L | L | L | H | L | L | L |
| LOW FREQUENCY | 4800Mbps ~ 5199Mbps | L | L | L | L | L | L | H | L | L |
| | 4400Mbps ~ 4799Mbps | L | L | L | L | L | L | L | H | L |
| | 4000Mbps ~ 4399Mbps | L | L | L | L | L | L | L | L | H |

SYSTEMS FOR PERFORMING A READ-MODIFY-WRITE OPERATION

CROSS-REFERENCE TO RELATED APPLICATIONS

The present application claims priority under 35 U.S.C 119(a) to Korean Patent Application No. 10-2020-0046329, filed on Apr. 16, 2020, which is incorporated herein by reference in its entirety.

BACKGROUND

1. Technical Field

Embodiments of the present disclosure may relate to systems for performing a read-modify-write operation adjusting an internal read time and an internal write time according to a frequency of a clock signal.

2. Related Art

Recently, various design schemes receiving and outputting multi-bit data during each clock cycle has been used to improve an operation speed of semiconductor devices. A typical design scheme for improving an operation speed of the semiconductor devices is to increase a frequency of a clock signal in order to receive and output the multi-bit data at a high speed. If a data transmission speed of the semiconductor devices becomes faster, probability of occurring errors may increase while the data are transmitted in the semiconductor devices. Accordingly, advanced design schemes have been proposed to guarantee the reliability of the data transmission.

Whenever data are transmitted in semiconductor devices, error codes such as an error detection code (EDC) and an error correction code (ECC) which are capable of detecting occurrence of errors may be generated and transmitted with the data to guarantee the reliability of data transmission.

Meanwhile, the semiconductor devices may provide a read-modify-write operation which is capable of supplementing insufficient bits of data by internally executing a read operation when the number of bits of data written to use the error code is insufficient.

SUMMARY

According to an embodiment, there may be provided a semiconductor memory device. The semiconductor memory device may include a read/write control circuit and an error correction circuit. The read/write control circuit may be configured to generate an internal write signal after generating an internal read signal from one of a plurality of shifted signals which are generated by shifting a read-modify-write command according to a frequency of a clock signal. The error correction circuit may be configured to correct an error included in internal data by performing a logical operation of read data generated by the internal read signal and the internal data to generate write data. The internal read signal may be enabled by a write set signal during the read-modify-write operation.

According to another embodiment, there may be provided a semiconductor memory device. The semiconductor memory device may include a voltage control circuit, a read/write control circuit, and an error correction circuit. The voltage control circuit may be configured to generate a first supply voltage and a second supply voltage having voltage levels that are adjusted according to an internal delay time. The read/write control circuit may be configured to generate an internal write signal after generating an internal read signal from a read-modify-write command based on a delay time which is adjusted according to a frequency of a clock signal, the first supply voltage, and the second supply voltage. The error correction circuit may be configured to correct an error included in internal data by performing a logical operation of read data generated by the internal read signal and the internal data to generate write data.

BRIEF DESCRIPTION OF THE DRAWINGS

FIG. 4 is a table illustrating a frequency information signal including frequency information of a clock signal according to an embodiment of the present disclosure.

DETAILED DESCRIPTION

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, and vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter with reference to the accompanying drawings. However, the embodiments described herein are for illustrative purposes only and are not intended to limit the scope of the present disclosure.

Figure 1:
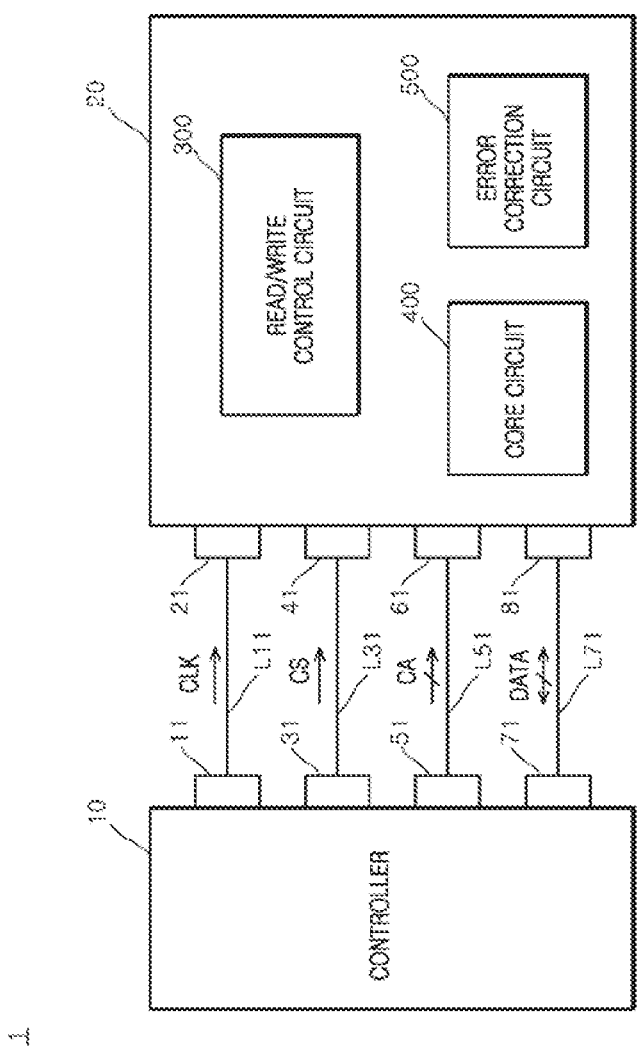
FIG. 1 is a block diagram illustrating a configuration of a system performing a read-modify-write operation according to an embodiment of the present disclosure.

As illustrated in FIG. 1, a system 1 performing a read-modify-write operation according to an embodiment may include a controller and a semiconductor device 20. The semiconductor device 20 may include a read/write control circuit 300, a core circuit 400, and an error correction circuit 500.

The controller 10 may include a first control pin 11, a second control pin 31, a third control pin 51, and a fourth control pin 71. The semiconductor device 20 may include a first semiconductor pin 21, a second semiconductor pin 41, a third semiconductor pin 61, and a fourth semiconductor pin 81. The first control pin 11 and the first semiconductor pin 21 may be connected to each other by a first transmission line 11. The second control pin 31 and the second semiconductor pin 41 may be connected to each other by a second transmission line L31. The third control pin 51 and the third semiconductor pin 61 may be connected to each other by a third transmission line L51. The fourth control pin 71 and the fourth semiconductor pin 81 may be connected to each other by a fourth transmission line L71. The controller 10 may transmit a clock signal CLK to the semiconductor device 20 through the first transmission line L11 to control the semiconductor device 20. The controller 10 may transmit a chip selection signal CS to the semiconductor device through the second transmission line L31 to control the semiconductor device 20. The controller 10 may transmit a command/address signal CA to the semiconductor device 20 through the third transmission line L51 to control the semiconductor device 20. The controller 10 may receive data DATA from the semiconductor device 20 or may transmit the data DATA to the semiconductor device 20, through the fourth transmission line L71.

The controller 10 may output the clock signal CLK, the chip selection signal CS, the command/address signal CA, and the data DATA to the semiconductor device 20 to perform the read-modify-write operation. The data DATA stored in the semiconductor device may be transmitted to the error correction circuit 500 during an internal read operation of the semiconductor device 20. During an internal write operation of the semiconductor device 20, the core circuit 400 may store data having an error that is corrected according to a result of a logical operation of data outputted during the internal read operation and data provided by an external device. The chip selection signal CS and the command/address signal CA may be consecutively outputted from the controller 10 in synchronization with an odd pulse or an even pulse included in the clock signal CLK. The read-modify-write operation may include the internal read operation and the internal write operation.

The read/write control circuit 300 may control the internal operation and the internal write operation according to a frequency of the clock signal CLK during the read-modify-write operation.

The core circuit 400 may output read data (RID<1:N> of FIG. 2) stored therein during the internal read operation of the read-modify-write operation. The core circuit 400 may store write data (WID<1:N> of FIG. 2) during the internal write operation of the read-modify-write operation.

The error correction circuit 500 may correct an error included in internal data (ID<1:M> of FIG. 2) to generate the write data (WID<1:N> of FIG. 2) during the internal write operation of the read-modify-write operation.

Figure 2:
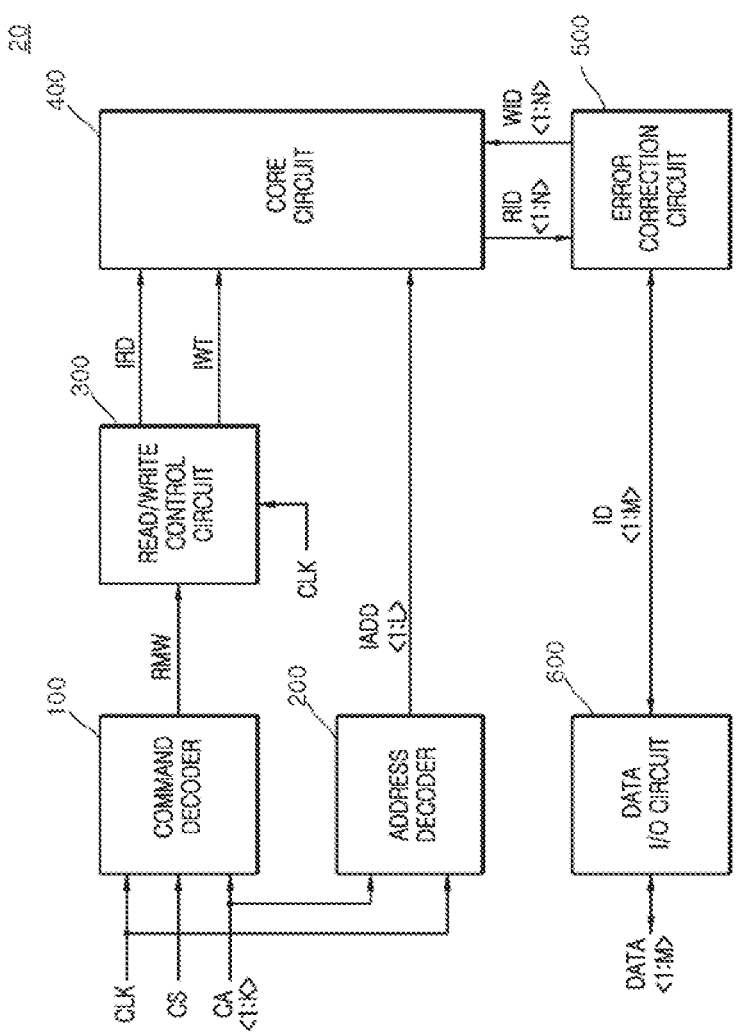
FIG. 2 is a block diagram illustrating a configuration of a semiconductor device included in the system illustrated in FIG. 1.

FIG. 2 is a block diagram illustrating a configuration of the semiconductor device 20. As illustrated in FIG. 2, the semiconductor device 20 may include a command decoder 100, an address decoder 200, the read/write control circuit 300, the core circuit 400, the error correction circuit 500, and a data input/output (I/O) circuit 600.

The command decoder 100 may decode the chip selection signal CS and the command/address signal CA<1:K> in synchronization with the clock signal CLK to generate a read-modify-write command RMW. The command decoder 100 may be synchronized with the clock signal CLK to generate the read-modify-write command RMW when the chip selection signal CS and the command/address signal CA<1:K> have a predetermined logic level combination. The command decoder 100 may be synchronized with the clock signal CLK to generate the read-modify-write command RMW when the chip selection signal CS and some bit signals of the command/address signal CA<1:K> have a predetermined logic level combination. Although the command decoder 100 is illustrated to generate the read-modify-write command RMW for performing the read-modify-write operation, the command decoder 100 may be designed to generate commands for performing various operations of the semiconductor device 20 according to the embodiments. The number of some bit signals included in the command/address signal CA<1:K> for generating the read-modify-write command RMW may be set to be different according to the embodiments, and a logic level combination of some bit signals of the command/address signal CA<1:K> for generating the read-modify-write command RMW may also be set to be different according to the embodiments. The number "K" of bits included in the command/address signal CA<1:K> may be set to be different according to the embodiments.

The address decoder 200 may be synchronized with the clock signal CLK to generate an internal address IADD<1:L> from the command/address signal CA<1:K>. The address decoder 200 may be synchronized with the clock signal CLK to generate the internal address IADD<1:L> from some bit signals of the command/address signal CA<1:K>. The address decoder 200 may decode some bit signals of the command/address signal CA<1:K> in synchronization with the clock signal CLK to generate the internal address IADD<1:L> having a plurality of bit signals, one of which is selectively enabled. The number of some bit signals of the command/address signal CA<1:K> for generating the internal address IADD<1:L> may be set to be different according to the embodiments, and a logic level combination of some bit signals of the command/address signal CA<1:K> for generating the internal address IADD<1:L> may also be set to be different according to the embodiments. The number "L" of bits included in the internal address IADD<1:L> may be set to be different according to the embodiments.

The read/write control circuit 300 may control a point in time when an internal read signal IRD for performing the internal read operation is generated, according to a frequency of the clock signal CLK during the read-modify-write operation. The read/write control circuit 300 may generate an internal write signal IWT after generating the internal read signal IRD during the read-modify-write operation. During the read-modify-write operation, the read/write control circuit 300 may generate the internal write signal IWT after generating the internal read signal IRD from any one of a plurality of shifted signals (i.e., first to fourth shifted signals SFT1, SFT2, SFT3, and SFT4 of FIG. 3) which are generated by shifting the read-modify-write command RMW according to a frequency of the clock signal CLK.

The core circuit 400 may output the read data RID<1:N> stored therein based on the internal read signal IRD and the internal address IADD<1:L> during the internal read operation of the read-modify-write operation. In an embodiment, the core circuit 400 may generate the read data RID<1:N> stored therein based on the internal read signal IRD. The core circuit 400 may store the write data WID<1:N> based on the internal write signal IWT and the internal address IADD<1:L> during the internal write operation of the read-modify-write operation. The number "N" of bits included in either the read data RID<1:N> or the write data WID<1:N> may be set to be different according to the embodiments.

The error correction circuit 500 may correct an error included in the internal data ID<1:M> by performing a logical operation on the read data RID<1:N> with the internal data ID<1:M> to generate the write data WID<1:N> during the read-modify-write operation. The error correction circuit 500 may use the read data RID<1:N> to perform a logical operation for correcting an error included in the internal data ID<1:M> during the read-modify-write operation. The number of bits included in the read data RID<1:N> for correcting an error included in the internal data ID<1:M> may be set to be different according to the embodiments. The error correction circuit 500 may correct an error of the read data RID<1:N> to generate the internal data ID<1:M> during a normal read operation. The error correction circuit 500 may correct an error of the internal data ID<1:M> to generate the write data WID<1:N> during a normal write operation. The number "M" of bits included in the internal data ID<1:M> may be set to be different according to the embodiments. The number "M" of bits included in the internal data ID<1:M> may be set to be half of the number "N" of bits included in the read data RID<1:N> or the write data WID<1:N>.

The data I/O circuit 600 may buffer the data DATA<1:M> to generate the internal data ID<1:M> during the read-modify-write operation. The data I/O circuit 600 may buffer the internal data ID<1:M> to generate the data DATA<1:M> during the normal read operation. The data I/O circuit 600 may buffer the data DATA<1:M> to generate the internal data ID<1:M> during the normal write operation. The number "M" of bits included in the data DATA<1:M> may be set to be different according to the embodiments.

Figure 3:
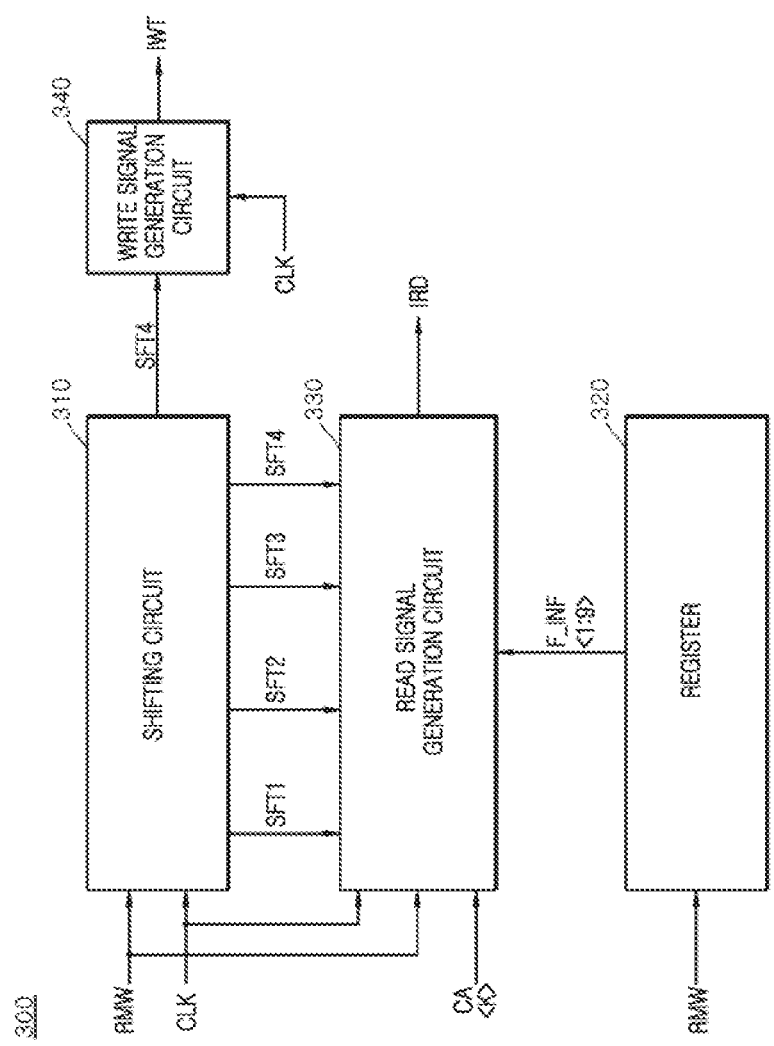
FIG. 3 is a block diagram illustrating a configuration of a read/write control circuit included in the semiconductor device illustrated in FIG. 2.

FIG. 3 is a block diagram illustrating a configuration of the read/write control circuit 300. As illustrated in FIG. 3, the read/write control circuit 300 may include a shifting circuit 310, a register 320, a read signal generation circuit 330, and a write signal generation circuit 340.

The shifting circuit 310 may shift the read-modify-write command RMW in synchronization with the clock signal CLK to generate the first to fourth shifted signals SFT1, SFT2, SFT3, and SFT4 which are sequentially enabled. The shifting circuit 310 may shift the read-modify-write command RMW by one cycle of the clock signal CLK to generate the first shifted signal SFT1. The shifting circuit 310 may shift the first shifted signal SFT1 by one cycle of the clock signal CLK to generate the second shifted signal SFT2. The shifting circuit 310 may shift the second shifted signal SFT2 by one cycle of the clock signal CLK to generate the third shifted signal SFT3. The shifting circuit 310 may shift the third shifted signal SFT3 by one cycle of the clock signal CLK to generate the fourth shifted signal SFT4.

The register 320 may generate first to ninth frequency information signals F_INF<1:9> including frequency information of the clock signal CLK when the read-modify-write command RMW is enabled. The frequency information of the clock signal CLK included in the first to ninth frequency information signals F_INF<1:9> will be described with reference to FIG. 4 later.

The read signal generation circuit 330 may be synchronized with the clock signal CLK to generate the internal read signal IRD from the first to fourth shifted signals SFT1, SFT2, SFT3, and SFT4 based on a delay time which is set by the read-modify-write command RMW, a write set signal CA<K> corresponding to a K$^{th}$ bit signal of the command/address signal CA<1:K>, and the first to ninth frequency information signals F_INF<1:9>. The delay time set by the read signal generation circuit 330 may be determined as a sum of a first delay time and a second delay time. The first delay time and the second delay time will be described with reference to FIG. 13 later. The write set signal CA<K> may have a logic "high" level to perform the read-modify-write operation.

The write signal generation circuit 340 may delay the fourth shifted signal SFT4 in synchronization with the clock signal CLK to generate the internal write signal IWT. The write signal generation circuit 340 may generate the internal write signal IWT by delaying the fourth shifted signal SFT4 by a write latency period in synchronization with the clock signal CLK. A delay time set by the write signal generation circuit 340 may be determined as a third delay time. The third delay time may be set to corresponding to a sum of the first delay time, the second delay time, and the write latency period.

The write latency period may be set as a period from a point in time when the command/address signal CA<1:K> for performing the read-modify-write operation is inputted to the semiconductor device 20 until a point in time when the write data WID<1:N> are generated. A period for delaying the fourth shifted signal SFT4 may be set to be different according to the embodiments.

In an embodiment, the first to ninth frequency information signals F_INF<1:9> including the frequency information on the clock signal CLK will be described hereinafter with reference to FIG. 4.

A range of a frequency of the clock signal CLK may be divided into a high frequency period, a normal frequency period, and a low frequency period.

The high frequency period of the clock signal CLK may include a first operation speed period (7200 megabits per second (Mbps)-7599 Mbps), a second operation speed period (6800 Mbps-7199 Mbps), and a third operation speed period (6400 Mbps-6799 Mbps). The first operation speed period (7200 Mbps-7599 Mbps) may correspond to a period from a frequency of 7200 Mbps to a frequency of 7599 Mbps, and the first frequency information signal F_INF<1> may be enabled to have a logic "high(H)" level in the first operation speed period (7200 Mbps-7599 Mbps). The second operation speed period (6800 Mbps-7199 Mbps) may correspond to a period from a frequency of 6800 Mbps to a frequency of 7199 Mbps, and the second frequency information signal F_INF<2> may be enabled to have a logic "high(H)" level in the second operation speed period (6800 Mbps-7199 Mbps). The third operation speed period (6400 Mbps-6799 Mbps) may correspond to a period from a frequency of 6400 Mbps to a frequency of 6799 Mbps, and the third frequency information signal F_INF<3> may be enabled to have a logic "high(H)" level in the third operation speed period (6400 Mbps-6799 Mbps).

The normal frequency period of the clock signal CLK may include a fourth operation speed period (6000 Mbps-6399 Mbps), a fifth operation speed period (5600 Mbps-5999 Mbps), and a sixth operation speed period (5200 Mbps-5599 Mbps). The fourth operation speed period (6000 Mbps-6399 Mbps) may correspond to a period from a frequency of 6000 Mbps to a frequency of 6399 Mbps, and the fourth frequency information signal F_INF<4> may be enabled to have a logic "high(H)" level in the fourth operation speed period (6000 Mbps-6399 Mbps). The fifth operation speed period (5600 Mbps-5999 Mbps) may correspond to a period from a frequency of 5600 Mbps to a frequency of 5999 Mbps, and the fifth frequency information signal F_INF<5> may be enabled to have a logic "high(H)" level in the fifth operation speed period (5600 Mbps-5999 Mbps). The sixth operation speed period (5200 Mbps-5599 Mbps) may correspond to a period from a frequency of 5200 Mbps to a frequency of 5599 Mbps, and the sixth frequency information signal F_INF<6> may be enabled to have a logic "high(H)" level in the sixth operation speed period (5200 Mbps-5599 Mbps).

The low frequency period of the clock signal CLK may include a seventh operation speed period (4800 Mbps-5199 Mbps), an eighth operation speed period (4400 Mbps-4799 Mbps), and a ninth operation speed period (4000 Mbps-4399 Mbps). The seventh operation speed period (4800 Mbps-5199 Mbps) may correspond to a period from a frequency of 4800 Mbps to a frequency of 5199 Mbps, and the seventh frequency information signal F_INF<7> may be enabled to have a logic "high(H)" level in the seventh operation speed period (4800 Mbps-5199 Mbps). The eighth operation speed period (4400 Mbps-4799 Mbps) may correspond to a period from a frequency of 4400 Mbps to a frequency of 4799 Mbps, and the eighth frequency information signal F_INF<8> may be enabled to have a logic "high(H)" level in the eighth operation speed period (4400 Mbps-4799 Mbps). The ninth operation speed period (4000 Mbps-4399 Mbps) may correspond to a period from a frequency of 4000 Mbps to a frequency of 4399 Mbps, and the ninth frequency information signal F_INF<9> may be enabled to have a logic "high(H)" level in the ninth operation speed period (4000 Mbps-4399 Mbps).

Figure 5:
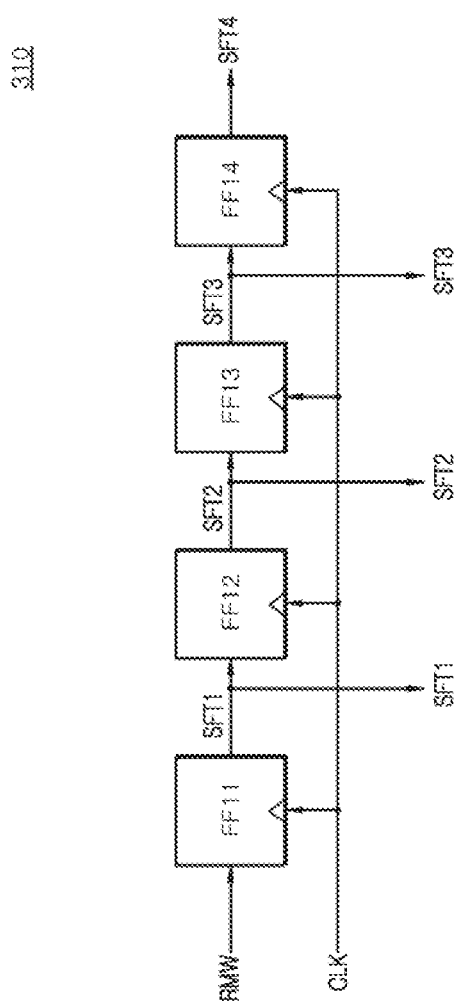
FIG. 5 is a block diagram illustrating a configuration of a shifting circuit included in the read/write control circuit illustrated in FIG. 3.

FIG. 5 is a bock diagram illustrating a configuration of the shifting circuit 310. As illustrated in FIG. 5, the shifting circuit 310 may be realized using flip-flops FF11, FF12, FF13, and FF14.

The flip-flop FF11 may shift the read-modify-write command RMW in synchronization with the clock signal CLK to generate the first shifted signal SFT1. The flip-flop FF11 may shift the read-modify-write command RMW by one cycle of the clock signal CLK to generate the first shifted signal SFT1.

The flip-flop FF12 may shift the first shifted signal SFT1 in synchronization with the clock signal CLK to generate the second shifted signal SFT2. The flip-flop FF11 may shift the first shifted signal SFT1 by one cycle of the clock signal CLK to generate the second shifted signal SFT2.

The flip-flop FF13 may shift the second shifted signal SFT2 in synchronization with the clock signal CLK to generate the third shifted signal SFT3. The flip-flop FF13 may shift the second shifted signal SFT2 by one cycle of the clock signal CLK to generate the third shifted signal SFT3.

The flip-flop FF14 may shift the third shifted signal SFT3 in synchronization with the clock signal CLK to generate the fourth shifted signal SFT4. The flip-flop FF14 may shift the third shifted signal SFT3 by one cycle of the clock signal CLK to generate the fourth shifted signal SFT4.

Although the shifting circuit 310 is illustrated to include four flip-flops in the present embodiment, the present disclosure is not limited thereto. For example, the number of the flip-flops included in the shifting circuit 310 may be set to be different according to the embodiments.

Figure 6:
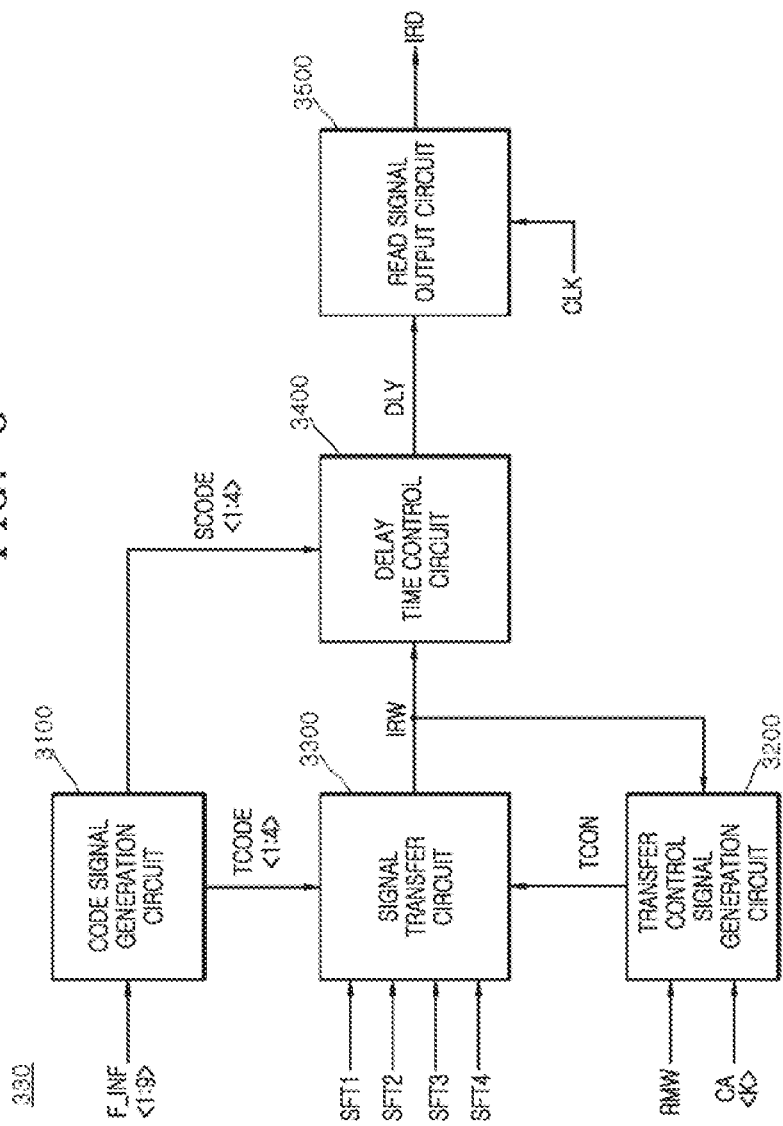
FIG. 6 is a block diagram illustrating a configuration of a read signal generation circuit included in the read/write control circuit illustrated in FIG. 3.

FIG. 6 is a block diagram illustrating a configuration of the read signal generation circuit 330. As illustrated in FIG.

6, the read signal generation circuit 330 may include a code signal generation circuit 3100, a transfer control signal generation circuit 3200, a signal transfer circuit 3300, a delay time control circuit 3400, and a read signal output circuit 3500.

The code signal generation circuit 3100 may generate first to fourth transfer code signals TCODE<1:4> and first to fourth speed code signals SCODE<1:4> based on the first to ninth frequency information signals F_INF<1:9>. The code signal generation circuit 3100 may generate the first to fourth transfer code signals TCODE<1:4>, one of which is selectively enabled by the first to ninth frequency information signals F_INF<1:9>. The code signal generation circuit 3100 may generate the first to fourth speed code signals SCODE<1:4> which are enabled by the first to ninth frequency information signals F_INF<1:9>.

The transfer control signal generation circuit 3200 may generate a transfer control signal TCON from the read-modify-write command RMW, an internal read/write signal IRW, and the write set signal CA<K>. The transfer control signal generation circuit 3200 may latch the write set signal CA<K> when the read-modify-write command RMW is enabled. The transfer control signal generation circuit 3200 may generate the transfer control signal TCON from the write set signal CA<K> when the internal read/write signal IRW is enabled.

The signal transfer circuit 3300 may generate the internal read/write signal IRW from any one of the first to fourth shifted signals SFT1, SFT2, SFT3, and SFT4 based on the transfer control signal TCON and the first to fourth transfer code signals TCODE<1:4>. The signal transfer circuit 3300 may output any one of the first to fourth shifted signals SFT1, SFT2, SFT3, and SFT4 as the internal read/write signal IRW based on the first to fourth transfer code signals TCODE<1:4> when the transfer control signal TCON is enabled.

The delay time control circuit 3400 may delay the internal read/write signal IRW by a delay time, which is set by the first to fourth speed code signals SCODE<1:4>, to generate a delay signal DLY.

The read signal output circuit 3500 may delay the delay signal DLY in synchronization with the clock signal CLK to generate the internal read signal IRD. The read signal output circuit 3500 may delay the delay signal DLY by a read latency period in synchronization with the clock signal CLK to generate the internal read signal IRD. The read latency period may be set as a period from a point in time when the command/address signal CA<1:K> for performing the read-modify-write operation is inputted to the semiconductor device 20 until a point in time when the read data RID<1:N> are generated. A period for delaying the delay signal DLY may be set to be different according to the embodiments.

Figure 7:
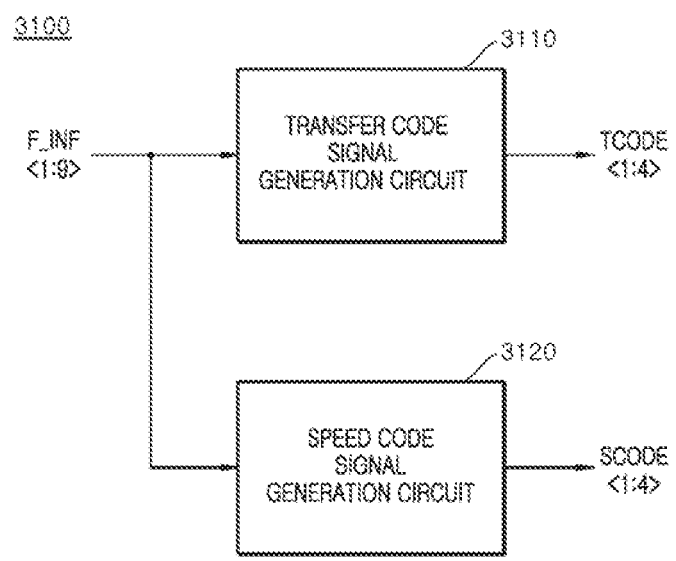
FIG. 7 is a block diagram illustrating a configuration of a code signal generation circuit included in the read signal generation circuit illustrated in FIG. 6.

FIG. 7 is a block diagram illustrating a configuration of the code signal generation circuit 3100. As illustrated in FIG. 7, the code signal generation circuit 3100 may include a transfer code signal generation circuit 3110 and a speed code signal generation circuit 3120.

The transfer code signal generation circuit 3110 may generate the first to fourth transfer code signals TCODE<1:4>, one of which is selectively enabled by the first to ninth frequency information signals F_INF<1:9>. The first to fourth transfer code signals TCODE<1:4> may be set as signals including information on a frequency period of the clock signal CLK.

The speed code signal generation circuit 3120 may generate the first to fourth speed code signals SCODE<1:4> which are enabled by the first to ninth frequency information signals F_INF<1:9>. The first to fourth speed code signals SCODE<1:4> may be set as signals including information on an operation speed period of the frequency period of the clock signal CLK.

Figure 8:
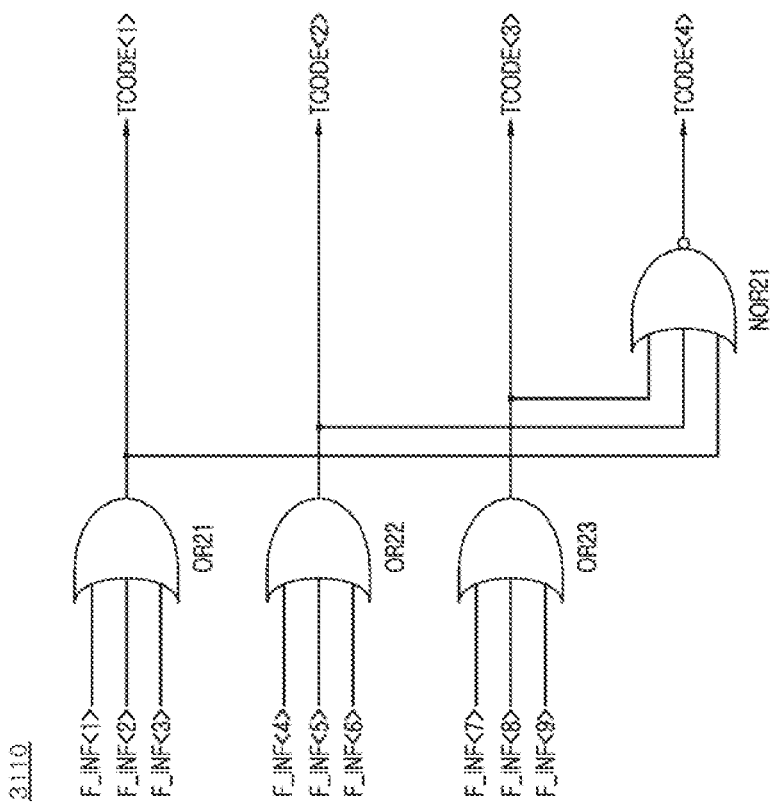
FIG. 8 is a circuit diagram illustrating a configuration of a transfer code signal generation circuit included in the code signal generation circuit illustrated in FIG. 7.

FIG. 8 is a circuit diagram illustrating a configuration of the transfer code signal generation circuit 3110. As illustrated in FIG. 8, the transfer code signal generation circuit 3110 may be realized using OR gates CR21, CR22, and CR23 and a NCR gate NOR21.

The OR gate OR21 may perform a logical OR operation of the first to third frequency information signals F_INF<1:3> to generate the first transfer code signal TCODE<1>. The OR gate OR21 may generate the first transfer code signal TCODE<1> which is enabled to have a logic "high" level when any one of the first to third frequency information signals F_INF<1:3> is enabled to have a logic "high" level. A case that the first transfer code signal TCODE<1> is enabled to have a logic "high," level may mean a case that a frequency of the clock signal CLK is within the range of the high frequency period.

The OR gate OR22 may perform a logical OR operation of the fourth to sixth frequency information signals F_INF<4:6> to generate the second transfer code signal TCODE<2>. The OR gate OR22 may generate the second transfer code signal TCODE<2> which is enabled to have a logic "high" level when any one of the fourth to sixth frequency information signals F_INF<4:6> is enabled to have a logic "high" level. A case that the second transfer code signal TCODE<2> is enabled to have a logic "high" level may mean a case that a frequency of the clock signal CLK is within the range of the normal frequency period.

The OR gate OR23 may perform a logical OR operation of the seventh to ninth frequency information signals F_INF<7:9> to generate the third transfer code signal TCODE<3>. The OR gate OR23 may generate the third transfer code signal TCODE<3> which is enabled to have a logic "high" level when any one of the seventh to ninth frequency information signals F_INF<7:9> is enabled to have a logic "high" level. A case that the third transfer code signal TCODE<3> is enabled to have a logic "high" level may mean a case that a frequency of the clock signal CLK is within the range of the low frequency period.

The NOR gate NOR21 may perform a logical NOR operation of the first to third transfer code signals TCODE<1:3> to generate the fourth transfer code signal TCODE<4>. The NOR gate NOR21 may generate the fourth transfer code signal TCODE<4> which is enabled to have a logic "high" level when all of the first to third transfer code signals TCODE<1:3> have a logic "low" level. A case that the fourth transfer code signal TCODE<4> is enabled to have a logic "high" level may mean a case that a frequency of the clock signal CLK is out of the ranges of the high frequency period, the normal frequency period, and the low frequency period.

Figure 9:
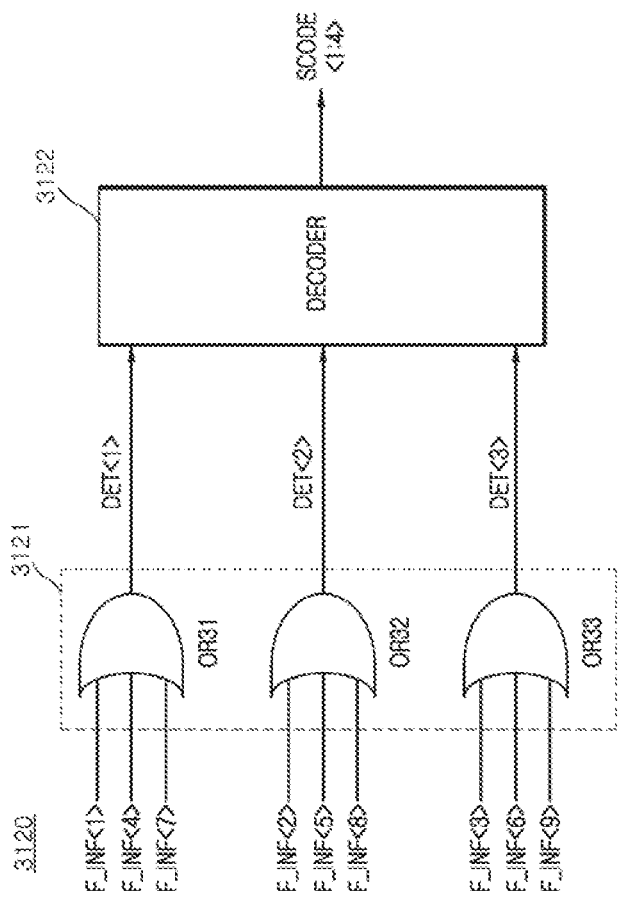
FIG. 9 illustrates a configuration of a speed code signal generation circuit included in the code signal generation circuit illustrated in FIG. 7.

FIG. 9 illustrates a configuration of the speed code signal generation circuit 3120. As illustrated in FIG. 9, the speed code signal generation circuit 3120 may include a detection signal generation circuit 3121 and a decoder 3122.

The detection signal generation circuit 3121 may be realized using OR gates OR31, OR32, and OR33.

The OR gate OR31 may perform a logical OR operation of the first frequency information signal F_INF<1>, the fourth frequency information signal F_INF<4>, and the seventh frequency information signal F_INF<7> to generate a first detection signal DET<1>. The OR gate OR31 may generate the first detection signal DET<1> which is enabled to have a logic "high" level when any one of the first frequency information signal F_INF<1>, the fourth frequency information signal F_INF<4>, and the seventh frequency information signal F_INF<7> has a logic "high" level. A case that the first detection signal DET<1> is enabled to have a logic "high" level may mean a case that a frequency of the clock signal CLK is within the range of the first operation speed period, the fourth operation speed period, or the seventh operation speed period (refer to the description of FIG. 4), and this may mean that a frequency of the clock signal CLK is within a highest frequency range in the high frequency period, the normal frequency period, or the low frequency period.

The OR gate OR32 may perform a logical OR operation of the second frequency information signal F_INF<2>, the fifth frequency information signal F_INF<5>, and the eighth frequency information signal F_INF<8> to generate a second detection signal DET<2>. The OR gate OR32 may generate the second detection signal DET<2> which is enabled to have a logic "high" level when any one of the second frequency information signal F_INF<2>, the fifth frequency information signal F_INF<5>, and the eighth frequency information signal F_INF<8> has a logic "high" level. A case that the second detection signal DET<2> is enabled to have a logic "high" level may mean a case that a frequency of the clock signal CLK is within the range of the second operation speed period, the fifth operation speed period, or the eighth operation speed period (refer to the description of FIG. 4), and this may mean that a frequency of the clock signal CLK is within an intermediate frequency range in the high frequency period, the normal frequency period, or the low frequency period.

The OR gate OR33 may perform a logical OR operation of the third frequency information signal F_INF<3>, the sixth frequency information signal F_INF<6>, and the ninth frequency information signal F_INF<9> to generate a third detection signal DET<3>. The OR gate OR33 may generate the third detection signal DET<3> which is enabled to have a logic "high" level when any one of the third frequency information signal F_INF<3>, the sixth frequency information signal F_INF<6>, and the ninth frequency information signal F_INF<9> has a logic "high" level. A case that the third detection signal DET<3> is enabled to have a logic "high" level may mean a case that a frequency of the clock signal CLK is within the range of the third operation speed period, the sixth operation speed period, or the ninth operation speed period (refer to the description of FIG. 4), and this may mean that a frequency of the clock signal CLK is within a lowest frequency range in the high frequency period, the normal frequency period, or the low frequency period.

The decoder 3122 may generate the first to fourth speed code signals SCODE<1:4> according to logic levels of the first to third detection signals DET<1:3>. The decoder 3122 may generate the first speed code signal SCODE<1> having a logic "low" level when the first detection signal DET<1> has a logic "high" level. The decoder 3122 may generate the first and second speed code signals SCODE<1:2> having a logic "low" level when the second detection signal DET<2> has a logic "high" level. The decoder 3122 may generate the first to third speed code signals SCODE<1:3> having a logic "low" level when the third detection signal DET<3> has a logic "high" level. The decoder 3122 may generate the first to fourth speed code signals SCODE<1:4> having a logic "low" level when all of the first to third detection signals DET<1:3> has a logic "low" level.

Figure 10:
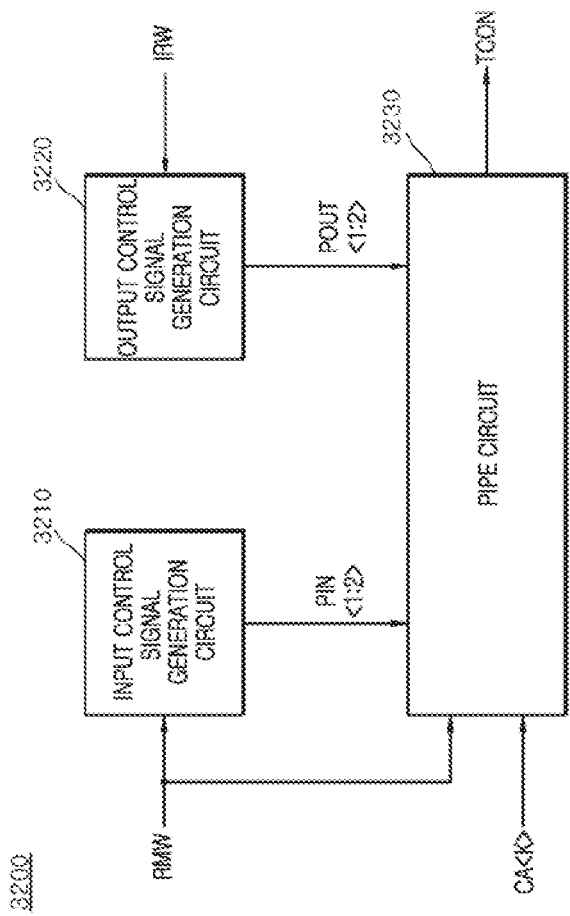
FIG. 10 is a block diagram illustrating a configuration of a transfer control signal generation circuit included in the read signal generation circuit illustrated in FIG. 6.

FIG. 10 is a block diagram illustrating a configuration of the transfer control signal generation circuit 3200. As illustrated in FIG. 10, the transfer control signal generation circuit 3200 may include an input control signal generation circuit 3210, an output control signal generation circuit 3220, and a pipe circuit 3230.

The input control signal generation circuit 3210 may generate first and second input control signals PIN<1:2> which are sequentially counted by the read-modify-write command RMW. The input control signal generation circuit 3210 may generate the first and second input control signals PIN<1:2> which are sequentially enabled when the read-modify-write command RMW is inputted to the input control signal generation circuit 3210. The input control signal generation circuit 3210 may enable the second input control signal PIN<2> when the read-modify-write command RMW is inputted to the input control signal generation circuit 3210 after the first input control signal PIN<1> is enabled. The input control signal generation circuit 3210 may enable the first input control signal PIN<1> when the read-modify-write command RMW is inputted to the input control signal generation circuit 3210 after the second input control signal PIN<2> is enabled.

The output control signal generation circuit 3220 may generate first and second output control signals POUT<1:2> which are sequentially counted by the internal read/write signal IRW. The output control signal generation circuit 3220 may generate the first and second output control signals POUT<1:2> which are sequentially enabled when the internal read/write signal IRW is inputted to the output control signal generation circuit 3220. The output control signal generation circuit 3220 may enable the second output control signal POUT<2> when the internal read/write signal IRW is inputted to the output control signal generation circuit 3220 after the first output control signal POUT<1> is enabled. The output control signal generation circuit 3220 may enable the first output control signal POUT<1> when the internal read/write signal IRW is inputted to the output control signal generation circuit 3220 after the second output control signal POUT<2> is enabled.

The pipe circuit 3230 may be synchronized with the read-modify-write command RMW to latch the write set signal CA<K> based on the first and second input control signals PIN<1:2>. The pipe circuit 3230 may output the latched signal of the write set signal CA<K> as the transfer control signal TCON based on the first and second output control signals POUT<1:2>.

Figure 11:
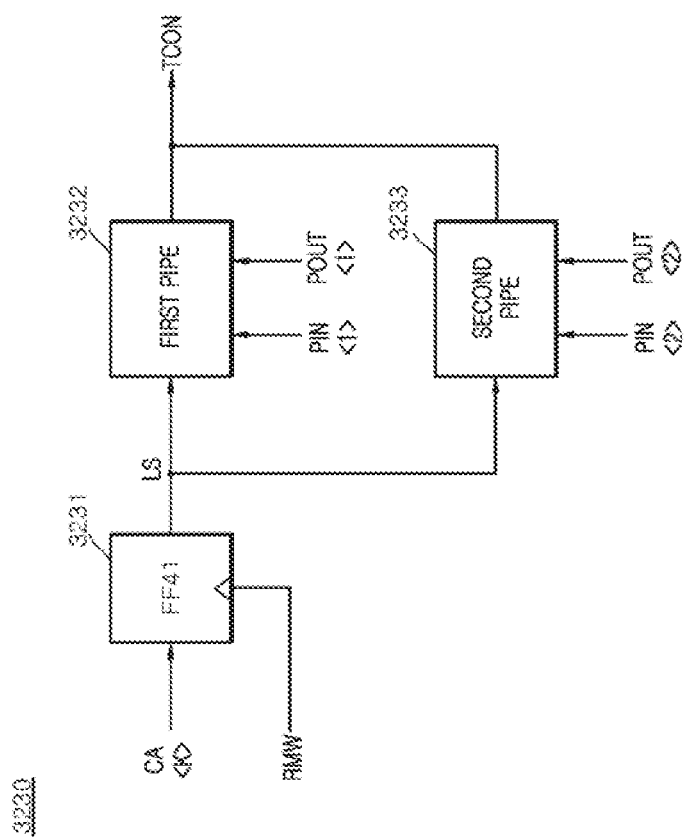
FIG. 11 is a block diagram illustrating a configuration of a pipe circuit included in the transfer control signal generation circuit illustrated in FIG. 10.

FIG. 11 is a block diagram illustrating a configuration of the pipe circuit 3230. As illustrated in FIG. 11, the pipe circuit 3230 may include a write latch circuit 3231, a first pipe 3232, and a second pipe 3233.

The write latch circuit 3231 may be realized using a flip-flop FF41. The write latch circuit 3231 may be synchronized with the read-modify-write command RMW to output the write set signal CA<K> as a write latch signal LS.

The first pipe 3232 may latch the write latch signal LS based on the first input control signal PIN<1>. The first pipe 3232 may latch the write latch signal LS when the first input control signal PIN<1> is enabled. The first pipe 3232 may output the latched signal of the write latch signal LS as the transfer control signal TCON based on the first output control signal POUT<1>. The first pipe 3232 may output the latched signal of the write latch signal LS as the transfer control signal TCON when the first output control signal POUT<1> is enabled.

The second pipe 3233 may latch the write latch signal LS based on the second input control signal PIN<2>. The second pipe 3233 may latch the write latch signal LS when the second input control signal PIN<2> is enabled. The second pipe 3233 may output the latched signal of the write latch signal LS as the transfer control signal TCON based on the second output control signal POUT<2>. The second pipe 3233 may output the latched signal of the write latch signal LS as the transfer control signal TCON when the second output control signal POUT<2> is enabled.

Figure 12:
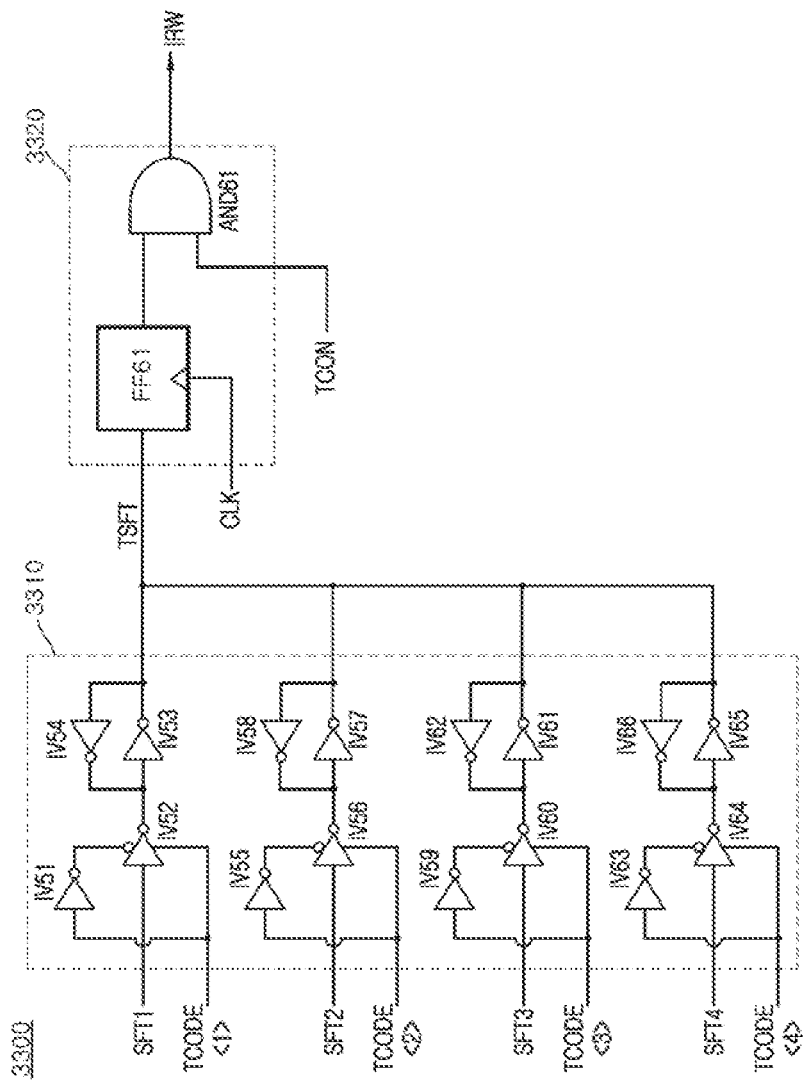
FIG. 12 is a circuit diagram illustrating a configuration of a signal transfer circuit included in the read signal generation circuit illustrated in FIG. 6.

FIG. 12 is a circuit diagram illustrating a configuration of the signal transfer circuit 3300. As illustrated in FIG. 12, the signal transfer circuit 3300 may include a selection transfer circuit 3310 and an internal read/write signal generation circuit 3320.

The selection transfer circuit 3310 may be realized using inverters IV51-IV65.

The inverters IV51, IV52, IV53, and IV54 may buffer the first shifted signal SFT1 to generate a transferred shift signal TSFT when the first transfer code signal TCODE<1> is enabled to have a logic "high" level.

The inverters IV55, IV56, IV57, and IV58 may buffer the second shifted signal SFT2 to generate the transferred shift signal TSFT when the second transfer code signal TCODE<2> is enabled to have a logic "high" level.

The inverters IV59, IV60, IV61, and IV62 may buffer the third shifted signal SFT3 to generate the transferred shift signal TSFT when the third transfer code signal TCODE<3> is enabled to have a logic "high" level.

The inverters IV63, IV64, IV65, and IV66 may buffer the fourth shifted signal SFT4 to generate the transferred shift signal TSFT when the fourth transfer code signal TCODE<4> is enabled to have a logic "high" level.

The selection transfer circuit 3310 may output one of the first to fourth shifted signals SFT1, SFT2, SFT3, and SFT4 as the transferred shift signal TSFT based on the first to fourth transfer code signals TCODE<1:4>.

The internal read/write signal generation circuit 3320 may be realized using a flip-flop FF61 and an AND gate AND61.

The flip-flop FF61 may be synchronized with the clock signal CLK to latch the transferred shift signal TSFT and to output the latched signal of the transferred shift signal TSFT.

The AND gate AND61 may buffer an output signal of the flip-flop FF61 based on the transfer control signal TCON to generate the internal read/write signal IRW. The AND gate AND61 may buffer an output signal of the flip-flop FF61 to generate the internal read/write signal IRW while the transfer control signal TCON is enabled to have a logic "high" level.

The internal read/write signal generation circuit 3320 may buffer the transferred shift signal TSFT in synchronization with the clock signal CLK to generate the internal read/write signal IRW while the transfer control signal TCON is enabled.

Figure 13:
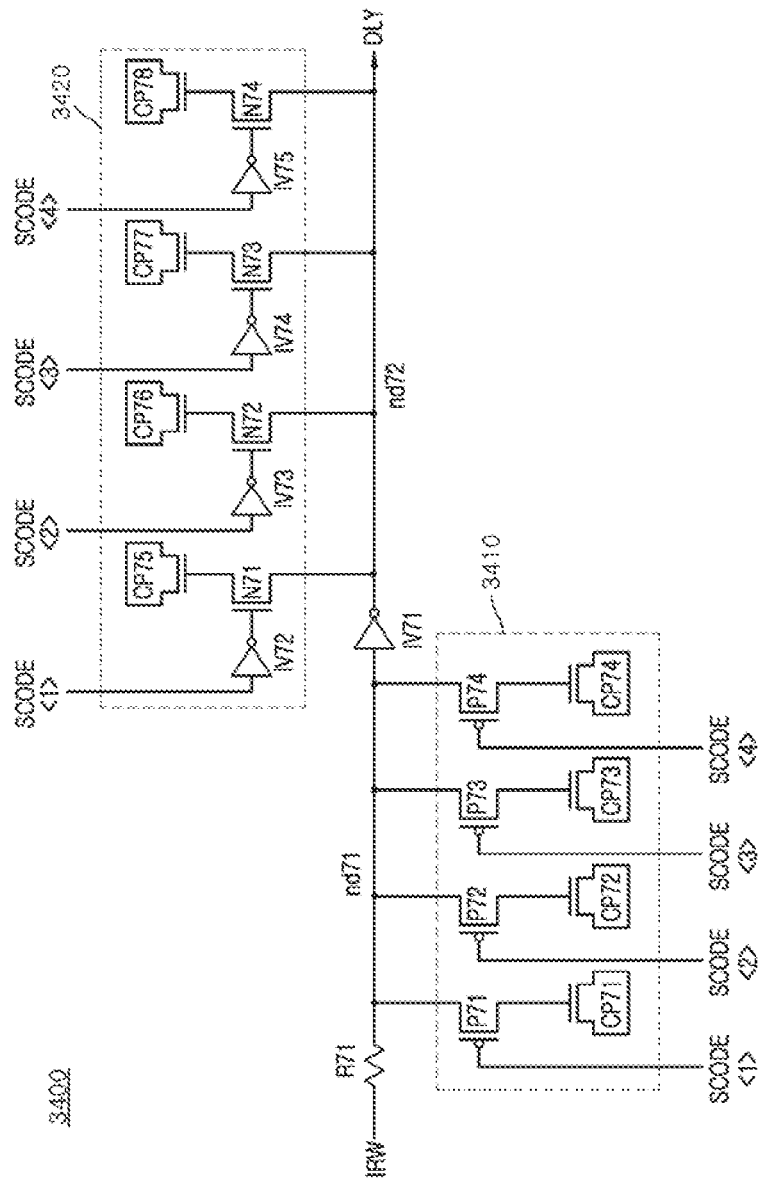
FIG. 13 is a circuit diagram illustrating a configuration of a delay time control circuit included in the read signal generation circuit illustrated in FIG. 6.

FIG. 13 is a circuit diagram illustrating a configuration of the delay time control circuit 3400. As illustrated in FIG. 13, the delay time control circuit 3400 may be realized using a resistor R71, a first delay time control circuit 3410, a buffer IV71, and a second delay time control circuit 3420.

The internal read/write signal IRW may be inputted to one terminal of the resistor R71, and the other terminal of the resistor R71 may be coupled to a node nd71.

The first delay time control circuit 3410 may be realized using PMOS transistors P71, P72, P73, and P74 and capacitors CP71, CP72, CP73, and CP74.

The PMOS transistor P71 may be coupled between the node nd71 and the capacitor CP71 and may be turned on when the first speed code signal SCODE<1> has a logic "low" level. The PMOS transistor P72 may be coupled between the node nd71 and the capacitor CP72 and may be turned on when the second speed code signal SCODE<2> has a logic "low" level. The PMOS transistor P73 may be coupled between the node nd71 and the capacitor CP73 and may be turned on when the third speed code signal SCODE<3> has a logic "low" level. The PMOS transistor P74 may be coupled between the node nd71 and the capacitor CP74 and may be turned on when the fourth speed code signal SCODE<4> has a logic "low" level.

The first delay time control circuit 3410 may be connected to the node nd71 and may control an amount of charges at the node nd71 based on the first to fourth speed code signals SCODE<1:4> to adjust a delay time of the first delay time control circuit 3410. The first delay time control circuit 3410 may control electrical connection between the node nd71 and the capacitors CP71-CP74 according to the number of signals enabled to have a logic "low" level among the first to fourth speed code signals SCODE<1:4>. The first delay time control circuit 3410 may control an amount of charges at the node nd71 according to the number of capacitors electrically connected to the node nd71 among the capacitors CP71-CP74, thereby adjusting a delay time of the first delay time control circuit 3410. A delay time of the first delay time control circuit 3410 adjusted by the first to fourth speed code signals SCODE<1:4> may be set as the first delay time.

The buffer IV71 may inversely buffer a signal of the node nd71 to output the inversely buffered signal of the signal of the node nd71 to a node nd72.

The second delay time control circuit 3420 may be realized using inverters IV72, IV73, IV74, and IV75, NMOS transistors N71, N72, N73, and N74, and capacitors CP75, CP76, CP77, and CP78.

The inverter IV72 may inversely buffer the first speed code signal SCODE<1> to output the inversely buffered signal of the first speed code signal SCODE<1>. The inverter IV73 may inversely buffer the second speed code signal SCODE<2> to output the inversely buffered signal of the second speed code signal SCODE<2>. The inverter IV74 may inversely buffer the third speed code signal SCODE<3> to output the inversely buffered signal of the third speed code signal SCODE<3>. The inverter IV75 may inversely buffer the fourth speed code signal SCODE<4> to output the inversely buffered signal of the fourth speed code signal SCODE<4>. The NMOS transistor N71 may be coupled between the node nd72 and the capacitor CP75 and may be turned on when an output signal of the inverter IV72 has a logic "high" level. The NMOS transistor N72 may be coupled between the node nd72 and the capacitor CP76 and may be turned on when an output signal of the inverter IV73 has a logic "high" level. The NMOS transistor N73 may be coupled between the node nd72 and the capacitor CP77 and may be turned on when an output signal of the inverter IV74 has a logic "high" level. The NMOS transistor N74 may be coupled between the node nd72 and the capacitor CP78 and may be turned on when an output signal of the inverter IV75 has a logic "high" level.

The second delay time control circuit 3420 may be connected to the node nd72 and may control an amount of charges at the node nd72 based on the first to fourth speed code signals SCODE<1:4> to adjust a delay time of the second delay time control circuit 3420. The second delay time control circuit 3420 may control electrical connection between the node nd72 and the capacitors CP75-CP78 according to the number of signals enabled to have a logic "low" level among the first to fourth speed code signals SCODE<1:4>. The second delay time control circuit 3420 may control an amount of charges at the node nd72 according to the number of capacitors electrically connected to the node nd72 among the capacitors CP75-CP78, thereby adjusting a delay time of the second delay time control circuit 3420. A delay time of the second delay time control circuit 3420 adjusted by the first to fourth speed code signals SCODE<1:4> may be set as the second delay time.

Figure 14:
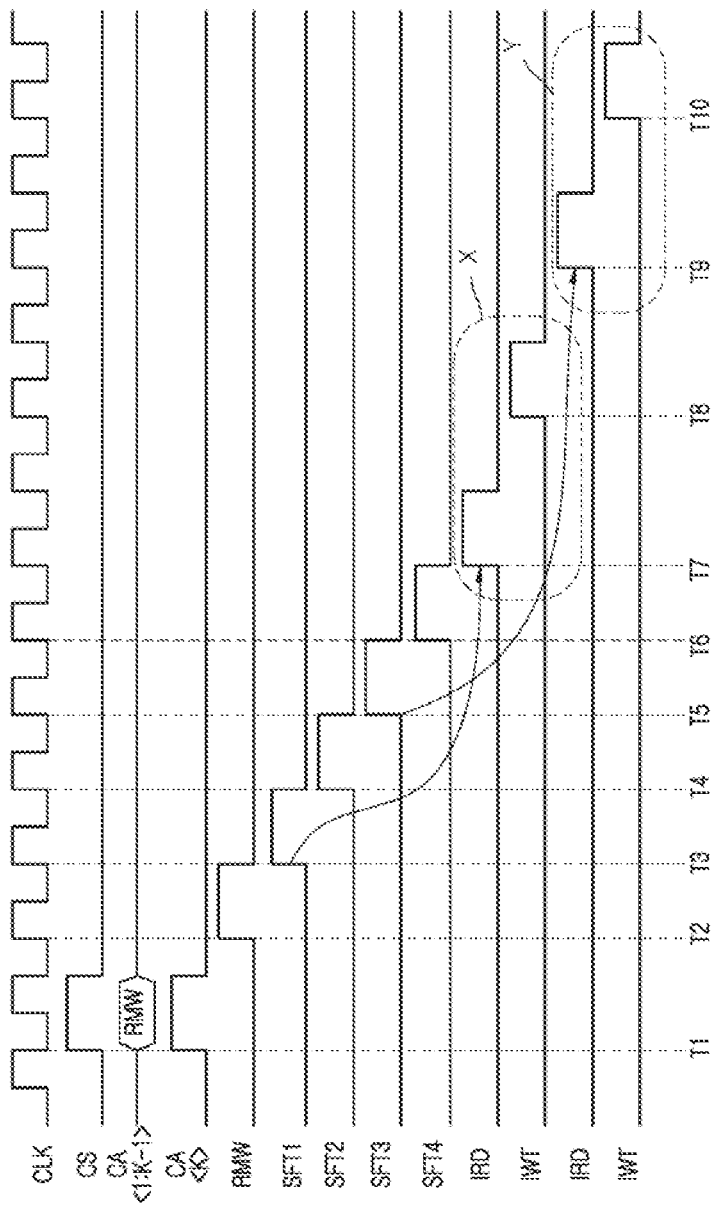
FIG. 14 is a timing diagram illustrating an operation of a system performing a read-modify-write operation according to an embodiment of the present disclosure.

The read-modify-write operation of the system 1 according to an embodiment of the present disclosure will be described hereinafter with reference to FIG. 14 in conjunction with an operation X for generating the internal read signal IRD and the internal write signal IWT from the first shifted signal SFT1 and an operation Y for generating the internal read signal IRD and the internal write signal IWT from the third shifted signal SFT3.

First, the operation X for generating the internal read signal IRD and the internal write signal IWT from the first shifted signal SFT1 will be described hereinafter.

At a point in time "T1", the controller 10 may output the clock signal CLK, the chip selection signal CS having a logic "high" level, the command/address signal CA<1:K>, and the data DATA<1:M> for performing the read-modify-write operation to the semiconductor device 20. In such a case, the first to (K−1)$^{th}$ bit signals CA<1:(K−1)> of the command/address signal CA<1:K> may be used to generate the read-modify-write command RMW and the internal address IADD<1:L>. The K$^{th}$ bit signals CA<K> of the command/address signal CA<1:K> may be used as the write set signal. The write set signal CA<K> outputted from the controller 10 may have a logic "high" level to perform the read-modify-write operation.

At a point in time "T2", the command decoder 100 may decode the chip selection signal CS having a logic "high" level and the command/address signal CA<1:(K−1)> in synchronization with the clock signal CLK to generate the read-modify-write command RMW having a logic "high" level.

At a point in time "T3", the shifting circuit 310 may shift the read-modify-write command RMW generated at the point in time "T2" by one cycle of the clock signal CLK to generate the first shifted signal SFT1 having a logic "high" level.

At a point in time "T4", the shifting circuit 310 may shift the first shifted signal SFT1 generated at the point in time "T3" by one cycle of the clock signal CLK to generate the second shifted signal SFT2 having a logic "high" level.

At a point in time "T5", the shifting circuit 310 may shift the second shifted signal SFT2 generated at the point in time "T4" by one cycle of the clock signal CLK to generate the third shifted signal SFT3 having a logic "high" level.

At a point in time "T6", the shifting circuit 310 may shift the third shifted signal SFT3 generated at the point in time "T5" by one cycle of the clock signal CLK to generate the fourth shifted signal SFT4 having a logic "high" level.

At a point in time "T7", the read signal generation circuit 330 may delay the first shifted signal SFT1 by a delay time, which is set by the first to ninth frequency information signals F_INF<1:9>, in synchronization with the clock signal CLK to generate the internal read signal IRD. That is, the read signal generation circuit 330 may generate the internal read signal IRD from the first shifted signal SFT1 among the first to fourth shifted signals SFT1, SFT2, SFT3, and SFT4 according to a frequency of the clock signal CLK.

The core circuit 400 may output the read data RID<1:N> based on the internal read signal IRD and the internal address IADD<1:L>.

The error correction circuit 500 may perform a logical operation of the internal data ID<1:M> generated from the data DATA<1: M> and the read data RID<1:N> to generate the write data WID<1:N>.

At a point in time "T8", the write signal generation circuit 340 may delay the fourth shifted signal SFT4, which is generated at the point in time "T6", in synchronization with the clock signal CLK to generate the internal write signal IWT.

The core circuit 400 may store the write data WID<1:N> based on the internal write signal IWT and the internal address IADD<1:L>.

Next, the operation Y for generating the internal read signal IRD and the internal write signal IWT from the third shifted signal SFT3 will be described hereinafter.

At a point in time "T9", the read signal generation circuit 330 may delay the third shifted signal SFT3 by a delay time, which is set by the first to ninth frequency information signals F_INF<1:9>, in synchronization with the clock signal CLK to generate the internal read signal IRD. That is, the read signal generation circuit 330 may generate the internal read signal IRD from the third shifted signal SFT3 among the first to fourth shifted signals SFT1, SFT2, SFT3, and SFT4 according to a frequency of the clock signal CLK.

The core circuit 400 may output the read data RID<1:N> based on the internal read signal IRD and the internal address IADD<1:L>.

The error correction circuit 500 may perform a logical operation of the internal data ID<1:M> generated from the data DATA<1:M> and the read data RID<1:N> to generate the write data WID<1: N>.

At a point in time "T10", the write signal generation circuit 340 may delay the fourth shifted signal SFT4, which is generated at the point in time "T6", in synchronization with the clock signal CLK to generate the internal write signal IWT.

The core circuit 400 may store the write data WID<1:N> based on the internal write signal IWT and the internal address IADD<1:L>.

As described above, a system for performing a read-modify-write operation according to an embodiment may adjust a point in time when an internal read operation is performed and a point in time when an internal write operation is performed according to a frequency of a clock signal. The system for performing the read-modify-write operation may adjust the point in time when the internal read operation is performed and the point in time when the internal write operation is performed according to a frequency of the clock signal, thereby uniformly adjusting a period between the internal read operation and the internal write operation.

Figure 15:
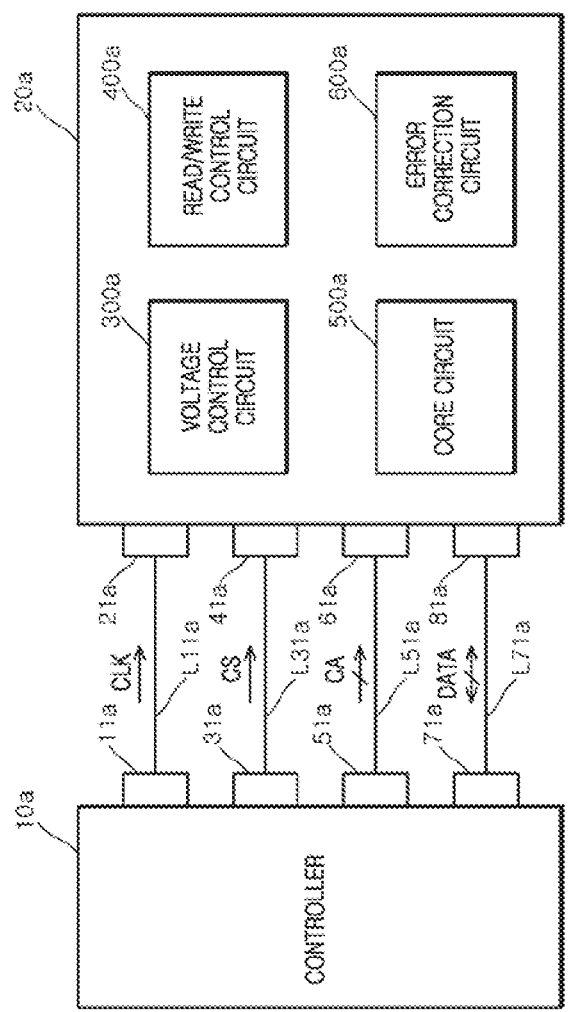
FIG. 15 is a block diagram illustrating a configuration of a system performing a read-modify-write operation according to another embodiment of the present disclosure.

As illustrated in FIG. 15, a system 2 performing a read-modify-write operation according to another embodiment of the present disclosure may include a controller 10a and a semiconductor device 20a. The semiconductor device 20a may include a voltage control circuit 300a, a read/write control circuit 400a, a core circuit 500a, and an error correction circuit 600a.

The controller 10a illustrated in FIG. 15 may be realized to have substantially the same configuration as the controller 10 illustrated in FIG. 1. Thus, because the controller 10a performs the same operation as the controller 10, detailed descriptions of the controller 10a will be omitted hereinafter.

The voltage control circuit 300a may generate a first supply voltage (VP of FIG. 16) and a second supply voltage (VN of FIG. 16) whose voltage levels are adjusted according to an internal delay time during the read-modify-write operation.

The read/write control circuit 400a may adjust a point in time when an internal read signal (IRD of FIG. 16) for performing a read operation is generated according to a frequency of a clock signal CLK, the first supply voltage (VP of FIG. 16), and the second supply voltage (VN of FIG. 16) during the read-modify-write operation.

The core circuit 500a illustrated in FIG. 15 may be realized to have substantially the same configuration as the core circuit 400 illustrated in FIG. 1. Thus, because the core circuit 500a performs the same operation as the core circuit 400, detailed descriptions of the core circuit 500a will be omitted hereinafter.

The error correction circuit 600a illustrated in FIG. 15 may be realized to have substantially the same configuration as the error correction circuit 500 illustrated in FIG. 1. Thus, because the error correction circuit 600a performs the same operation as the error correction circuit 500, detailed descriptions of the error correction circuit 600a will be omitted hereinafter.

Figure 16:
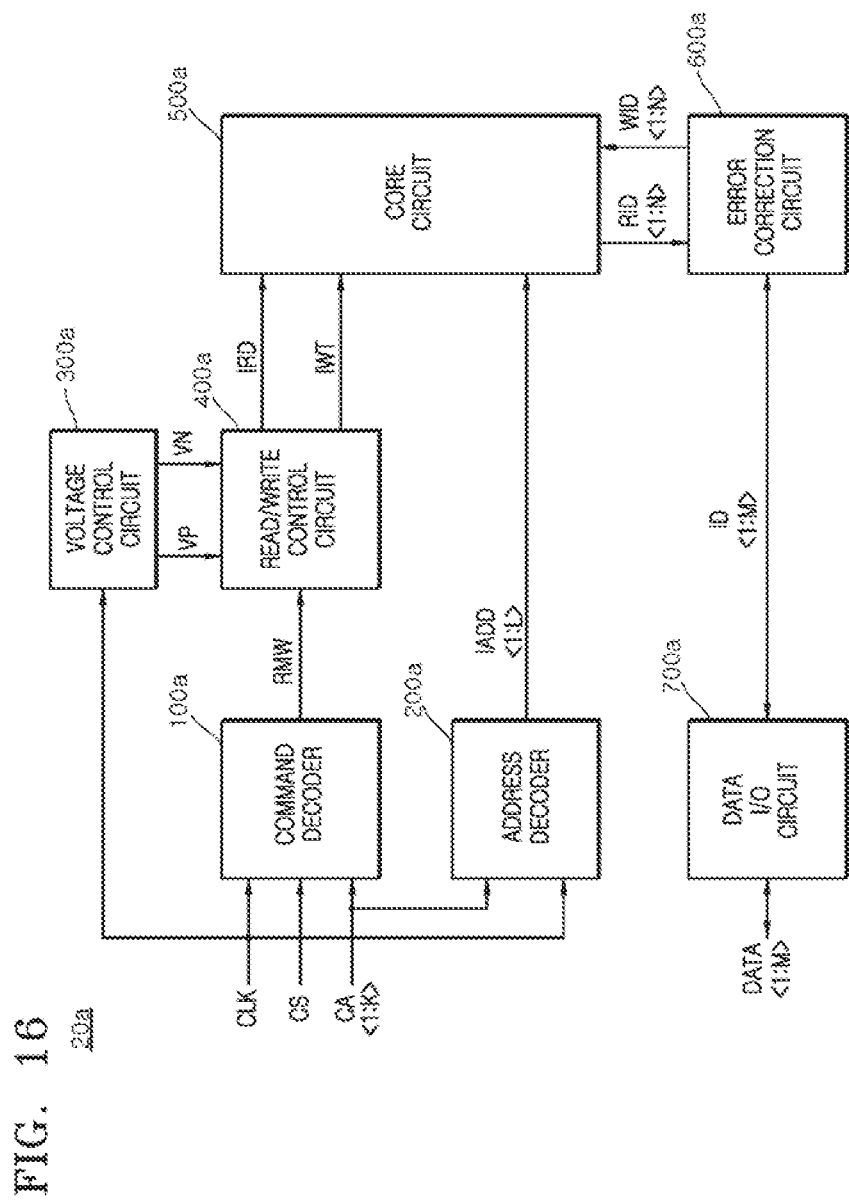
FIG. 16 is a block diagram illustrating a configuration of a semiconductor device included in the system illustrated in FIG. 15.

FIG. 16 is a block diagram illustrating a configuration of the semiconductor device 20a. As illustrated in FIG. 16, the semiconductor device 20a may include a command decoder 100a, an address decoder 200a, the voltage control circuit 300a, the read/write control circuit 400a, the core circuit 500a, the error correction circuit 600a, and a data I/O circuit 700a.

The command decoder 100a illustrated in FIG. 16 may be realized to have substantially the same configuration as the command decoder 100 illustrated in FIG. 2. Thus, because the command decoder 100a performs the same operation as the command decoder 100, detailed descriptions of the command decoder 100a will be omitted hereinafter.

The address decoder 200a illustrated in FIG. 16 may be realized to have substantially the same configuration as the address decoder 200 illustrated in FIG. 2. Thus, because the address decoder 200a performs the same operation as the address decoder 200, detailed descriptions of the address decoder 200a will be omitted hereinafter.

The voltage control circuit 300a may generate the first supply voltage VP and the second supply voltage VN whose voltage levels are adjusted according to an internal delay time during the read-modify-write operation. As the internal delay time increases, the voltage levels of the first supply voltage VP and the second supply voltage VN may be lowered. In contrast, if the internal delay time is reduced, the voltage levels of the first supply voltage VP and the second supply voltage VN may be boosted.

The read/write control circuit 400a may adjust a point in time when the internal read signal IRD for performing the read operation is generated according to a frequency of the clock signal CLK, the first supply voltage VP, and the second supply voltage VN during the read-modify-write operation. The read/write control circuit 400a may generate an internal write signal IWT after generating the internal read signal IRD during the read-modify-write operation. The read/write control circuit 400a may generate the internal write signal IWT after generating the internal read signal IRD from any one of a plurality of shifted signals, which are generated by shifting a read-modify-write command RMW, according to a frequency of the clock signal CLK, the first supply voltage VP, and the second supply voltage VN during the read-modify-write operation.

The core circuit 500a illustrated in FIG. 16 may be realized to have substantially the same configuration as the core circuit 400 illustrated in FIG. 2. Thus, because the core circuit 500a performs the same operation as the core circuit 400, detailed descriptions of the core circuit 500a will be omitted hereinafter.

The error correction circuit 600a illustrated in FIG. 16 may be realized to have substantially the same configuration as the error correction circuit 500 illustrated in FIG. 2. Thus, because the error correction circuit 600a performs the same operation as the error correction circuit 500, detailed descriptions of the error correction circuit 600a will be omitted hereinafter.

The data I/O circuit 700a illustrated in FIG. 16 may be realized to have substantially the same configuration as the data I/O circuit 600 illustrated in FIG. 2. Thus, because the data I/O circuit 700a performs the same operation as the data I/O circuit 600, detailed descriptions of the data I/O circuit 700a will be omitted hereinafter.

Figure 17:
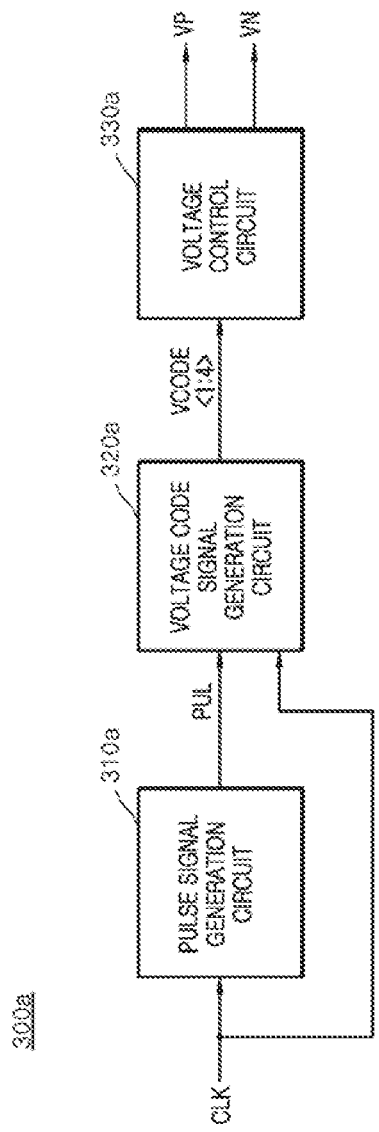
FIG. 17 is a block diagram illustrating a configuration of a voltage control circuit included in the semiconductor device illustrated in FIG. 16.

FIG. 17 is a block diagram illustrating a configuration of the voltage control circuit 300a. As illustrated in FIG. 17, the voltage control circuit 300a may include a pulse signal generation circuit 310a, a voltage code signal generation circuit 320a, and a voltage control circuit 330a.

The pulse signal generation circuit 310a may generate a pulse signal PUL including a pulse which is generated in synchronization with a rising edge of the clock signal CLK. The pulse signal generation circuit 310a may generate the pulse signal PUL including a pulse which is generated in synchronization with a falling edge of the clock signal CLK.

The voltage code signal generation circuit 320a may be synchronized with the clock signal CLK to detect a delay period of the pulse signal PUL according to the internal delay time. The voltage code signal generation circuit 320a may generate first to fourth voltage code signals VCODE<1:4> according to a detection result of the delay period of the pulse signal PUL.

The voltage control circuit 330a may generate the first supply voltage VP and the second supply voltage VN whose voltage levels are controlled according to a logic level combination of the first to fourth voltage code signals VCODE<1:4>. When the internal delay time increases, voltage levels of the first supply voltage VP and the second supply voltage VN may be lowered. When the internal delay time is reduced, voltage levels of the first supply voltage VP and the second supply voltage VN may be boosted. The first supply voltage VP and the second supply voltage VN may be supplied to a plurality of capacitors for adjusting a delay time.

Figure 18:
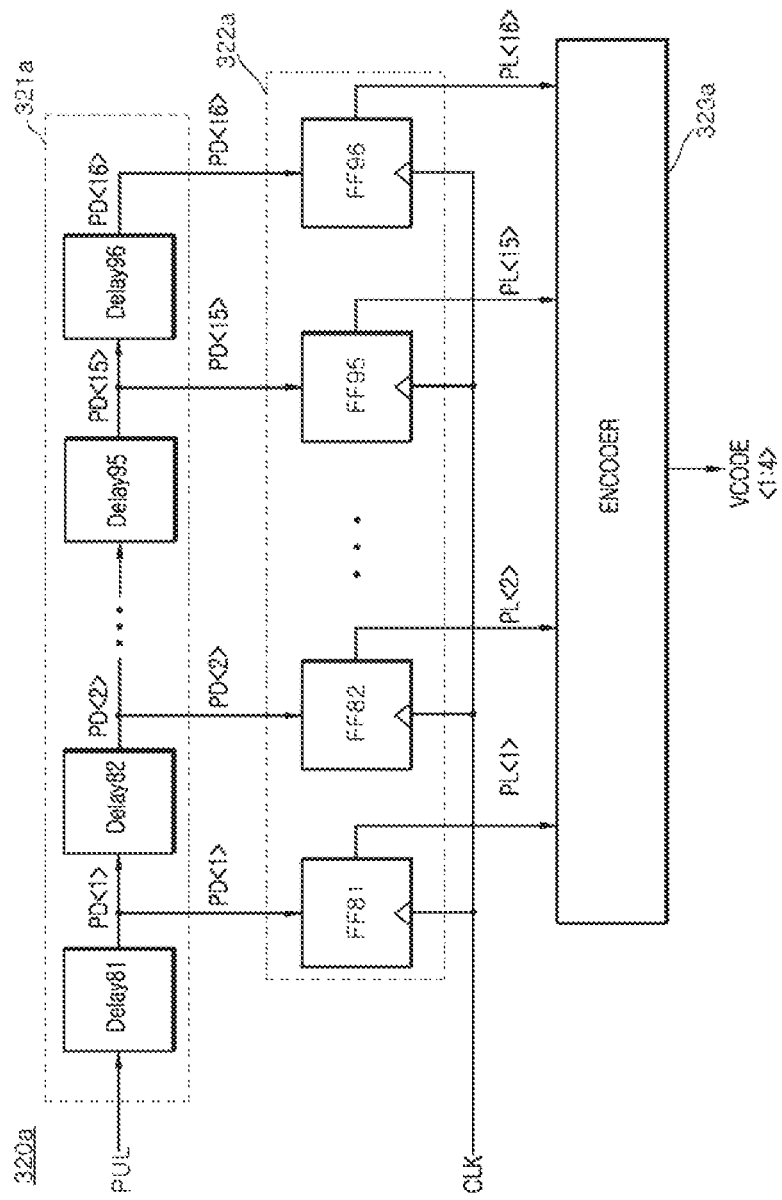
FIG. 18 is a block diagram illustrating a configuration of a voltage code signal generation circuit included in the voltage control circuit illustrated in FIG. 17.

FIG. 18 is a block diagram illustrating a configuration of the voltage code signal generation circuit 320a. As illustrated in FIG. 18, the voltage code signal generation circuit 320a may include a pulse delay signal generation circuit 321a, a pulse latch signal generation circuit 322a, and an encoder 323a.

The pulse delay signal generation circuit 321a may include a plurality of delay circuits Delay81-Delay96. The pulse delay signal generation circuit 321a may delay the pulse signal PUL to generate first to sixteenth pulse delay signals PD<1:16> which are sequentially enabled. Although the pulse delay signal generation circuit 321a is illustrated to include 16 delay circuits in the present embodiment, the number of the delay circuits included in the pulse delay signal generation circuit 321a may be set to be different according to the embodiments.

The pulse latch signal generation circuit 322a may include a plurality of flip-flops FF81-FF96. The pulse latch signal generation circuit 322a may latch the first to sixteenth pulse delay signals PD<1:16> in synchronization with the clock signal CLK to generate first to sixteenth pulse latch signals PL<1:16>. Although the pulse latch signal generation circuit 322a is illustrated to include 16 flip-flops in the present embodiment, the number of the flip-flops included in the pulse latch signal generation circuit 322a may be set to be different according to the embodiments.

The encoder 323a may encode the first to sixteenth pulse latch signals PL<1:16> to generate the first to fourth voltage code signals VCODE<1:4>.

The voltage code signal generation circuit 320a may detect the internal delay time by detecting the number of signals having a logic "high" level among the first to sixteenth pulse latch signals PL<1:16> during one cycle of the clock signal CLK. For example, when all of the first to sixteenth pulse latch signals PL<1:16> have a logic "high" level, the internal delay time may be set to be shortest. In addition, when only the first to eighth pulse latch signals PL<1:8> have a logic "high" level, the internal delay time may be set to be relatively longer as compared with a case that the all of the first to sixteenth pulse latch signals PL<1:16> have a logic "high" level.

Figure 19:
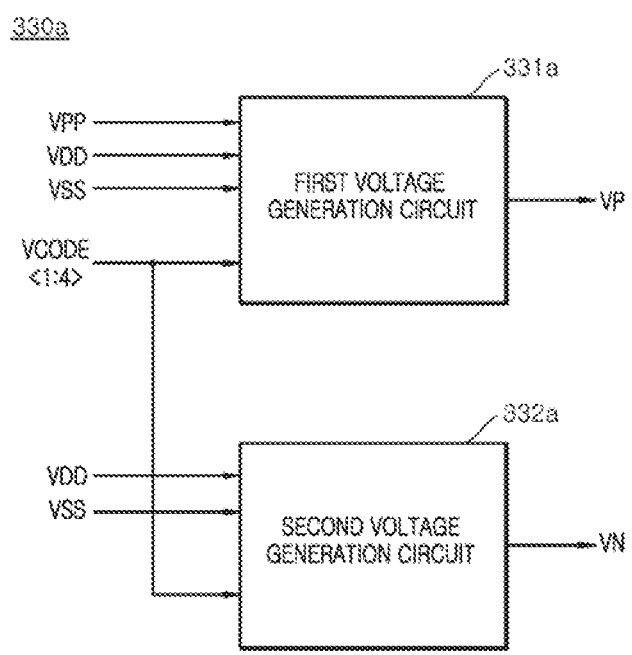
FIG. 19 is a block diagram illustrating a configuration of a voltage control circuit included in the voltage control circuit illustrated in FIG. 17.

FIG. 19 is a block diagram illustrating a configuration of the voltage control circuit 330a. As illustrated in FIG. 19, the voltage control circuit 330a may include a first voltage generation circuit 331a and a second voltage generation circuit 332a.

The first voltage generation circuit 331a may generate the first supply voltage VP based on the first to fourth voltage code signals VCODE<1:4>, a high voltage VPP, a power source voltage VDD, and a ground voltage VSS. The first voltage generation circuit 331a may generate the first supply voltage VP from the high voltage VPP, which is higher than the power source voltage VDD, according to a logic level combination of the first to fourth voltage code signals VCODE<1:4>.

The second voltage generation circuit 332a may generate the second supply voltage VN based on the first to fourth voltage code signals VCODE<1:4>, the power source voltage VDD, and the ground voltage VSS. The second voltage generation circuit 332a may generate the second supply voltage VN from the power source voltage VDD according to a logic level combination of the first to fourth voltage code signals VCODE<1:4>.

Figure 20:
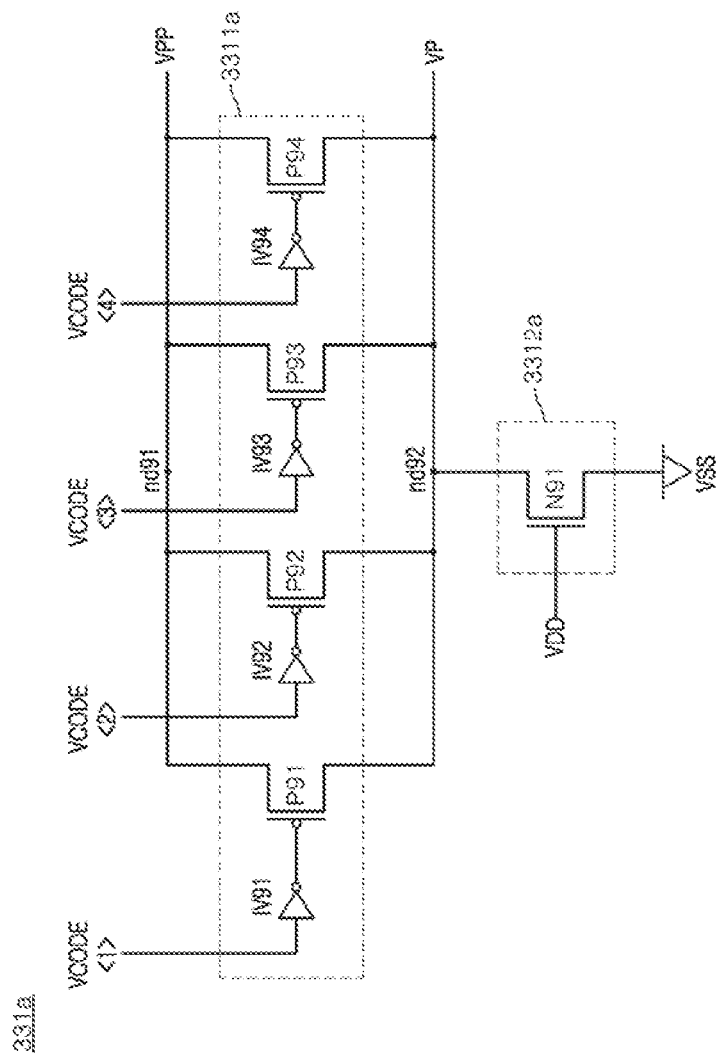
FIG. 20 is a circuit diagram illustrating a configuration of a first voltage generation circuit included in the voltage control circuit illustrated in FIG. 19.

FIG. 20 is a circuit diagram illustrating a configuration of the first voltage generation circuit 331a. As illustrated in FIG. 20, the first voltage generation circuit 331a may include a first drive circuit 3311a and a second drive circuit 3312a.

The first drive circuit 3311a may be coupled between a node nd91 to which the high voltage VPP is applied and a node nd92 through which the first voltage VP is outputted. The first drive circuit 3311a may be realized using inverters IV91, IV92, IV93, and IV94 and PMOS transistors P91, P92, P93, and P94.

The inverter IV91 may inversely buffer the first voltage code signal VCODE<1> to output the inversely buffered signal of the first voltage code signal VCODE<1>. The inverter IV92 may inversely buffer the second voltage code signal VCODE<2> to output the inversely buffered signal of the second voltage code signal VCODE<2>. The inverter IV93 may inversely buffer the third voltage code signal VCODE<3> to output the inversely buffered signal of the third voltage code signal VCODE<3>. The inverter IV94 may inversely buffer the fourth voltage code signal VCODE<4> to output the inversely buffered signal of the fourth voltage code signal VCODE<4>.

The PMOS transistor P91 may be turned on to electrically connect the node nd91 to the node nd92 when an output signal of the inverter IV91 has a logic "low" level. In such a case, the node nd92 having the first supply voltage VP may be driven to the high voltage VPP. The PMOS transistor P92 may be turned on to electrically connect the node nd91 to the node nd92 when an output signal of the inverter IV92 has a logic "low" level. In such a case, the node nd92 having the first supply voltage VP may be driven to the high voltage VPP. The PMOS transistor P93 may be turned on to electrically connect the node nd91 to the node nd92 when an output signal of the inverter IV93 has a logic "low" level. In such a case, the node nd92 having the first supply voltage VP may be driven to the high voltage VPP. The PMOS transistor P94 may be turned on to electrically connect the node nd91 to the node nd92 when an output signal of the inverter IV94 has a logic "low" level. In such a case, the node nd92 having the first supply voltage VP may be driven to the high voltage VPP.

The second drive circuit 3312a may be coupled between the node nd92 and a supply terminal of the ground voltage VSS. The second drive circuit 3312a may be realized using an NMOS transistor N91.

The NMOS transistor N91 may be turned on to electrically connect the node nd92 to the supply terminal of the ground voltage VSS when the power source voltage VDD is inputted to the NMOS transistor N91.

Meanwhile, an operation for adjusting a voltage level of the first supply voltage VP in the first voltage generation circuit 331a will be described hereinafter.

A drivability of the first voltage generation circuit 331a for driving the first supply voltage VP to the high voltage VPP may increase when the number of signals having a logic "high" level among the first to fourth voltage code signals VCODE<1:4> increases. This is because the number of PMOS transistors turned on among the PMOS transistors P91, P92, P93, and P94 increases if the number of signals having a logic "high" level among the first to fourth voltage code signals VCODE<1:4> increases. If the drivability of the first voltage generation circuit 331a for driving the first supply voltage VP to the high voltage VPP increases, the first supply voltage VP may be driven to the high voltage VPP more quickly.

In contrast, the drivability of the first voltage generation circuit 331a for driving the first supply voltage VP to the high voltage VPP may be reduced when the number of signals having a logic "high" level among the first to fourth voltage code signals VCODE<1:4> is reduced. This is because the number of PMOS transistors turned on among the PMOS transistors P91, P92, P93, and P94 is reduced if the number of signals having a logic "high" level among the first to fourth voltage code signals VCODE<1:4> is reduced. If the drivability of the first voltage generation circuit 331a for driving the first supply voltage VP to the high voltage VPP is reduced, the first supply voltage VP may be driven to the high voltage VPP more slowly.

Figure 21:
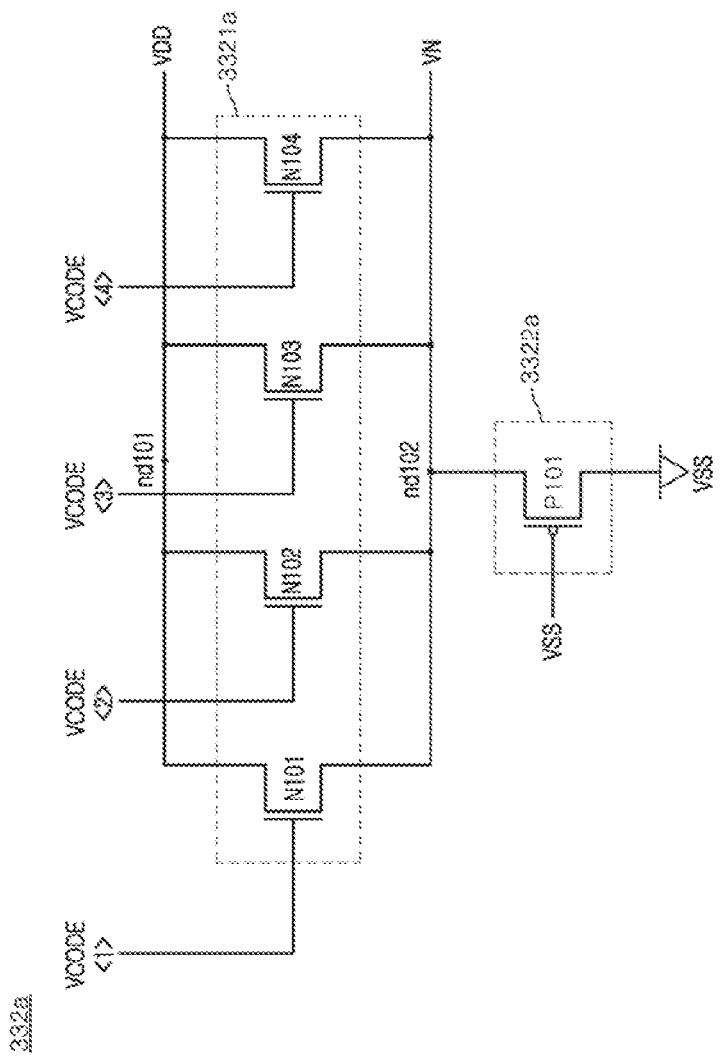
FIG. 21 is a circuit diagram illustrating a configuration of a second voltage generation circuit included in the voltage control circuit illustrated in FIG. 19.

FIG. 21 is a circuit diagram illustrating a configuration of the second voltage generation circuit 332a. As illustrated in FIG. 21, the second voltage generation circuit 332a may include a third drive circuit 3321a and a fourth drive circuit 3322a.

The third drive circuit 3321a may be coupled between a node nd101 to which the power source voltage VDD is applied and a node nd102 through which the second voltage VN is outputted. The third drive circuit 3321a may be realized using NMOS transistors N101, N102, N103, and N104.

The NMOS transistor N101 may be turned on to electrically connect the node nd101 to the node nd102 when the first voltage code signal VCODE<1> has a logic "high" level. In such a case, the node nd102 having the second supply voltage VN may be driven to the power source voltage VDD. The NMOS transistor N102 may be turned on to electrically connect the node nd101 to the node nd102 when the second voltage code signal VCODE<2> has a logic "high" level. In such a case, the node nd102 having the second supply voltage VN may be driven to the power source voltage VDD. The NMOS transistor N103 may be turned on to electrically connect the node nd101 to the node nd102 when the third voltage code signal VCODE<3> has a logic "high" level. In such a case, the node nd102 having the second supply voltage VN may be driven to the power source voltage VDD. The NMOS transistor N104 may be turned on to electrically connect the node nd101 to the node nd102 when the fourth voltage code signal VCODE<4> has a logic "high" level. In such a case, the node nd102 having the second supply voltage VN may be driven to the power source voltage VDD.

The fourth drive circuit 3322a may be coupled between the node nd102 and the supply terminal of the ground voltage VSS. The fourth drive circuit 3322a may be realized using a PMOS transistor P101.

The PMOS transistor P101 may be turned on to electrically connect the node nd102 to the supply terminal of the ground voltage VSS when the ground voltage VSS is inputted to the PMOS transistor N101.

Meanwhile, an operation for adjusting a voltage level of the second supply voltage VN in the second voltage generation circuit 332a will be described hereinafter.

A drivability of the second voltage generation circuit 332a for driving the second supply voltage VN to the power source voltage VDD may increase when the number of signals having a logic "high" level among the first to fourth voltage code signals VCODE<1:4> increases. This is because the number of NMOS transistors turned on among the NMOS transistors N101, N102, N103, and N104 increases if the number of signals having a logic "high" level among the first to fourth voltage code signals VCODE<1:4> increases. If the drivability of the second voltage generation circuit 332a for driving the second supply voltage VN to the power source voltage VDD increases, the second supply voltage VN may be driven into the power source voltage VDD more quickly.

In contrast, the drivability of the second voltage generation circuit 332a for driving the second supply voltage VN into the power source voltage VDD may be reduced when the number of signals having a logic "high" level among the first to fourth voltage code signals VCODE<1:4> is reduced. This is because the number of NMOS transistors turned on among the NMOS transistors N101, N102, N103, and N104 is reduced if the number of signals having a logic "high" level among the first to fourth voltage code signals VCODE<1:4> is reduced. If the drivability of the second voltage generation circuit 332a for driving the second supply voltage VN into the power source voltage VDD is reduced, the second supply voltage VN may be driven to the power source voltage VDD more slowly.

Figure 22:
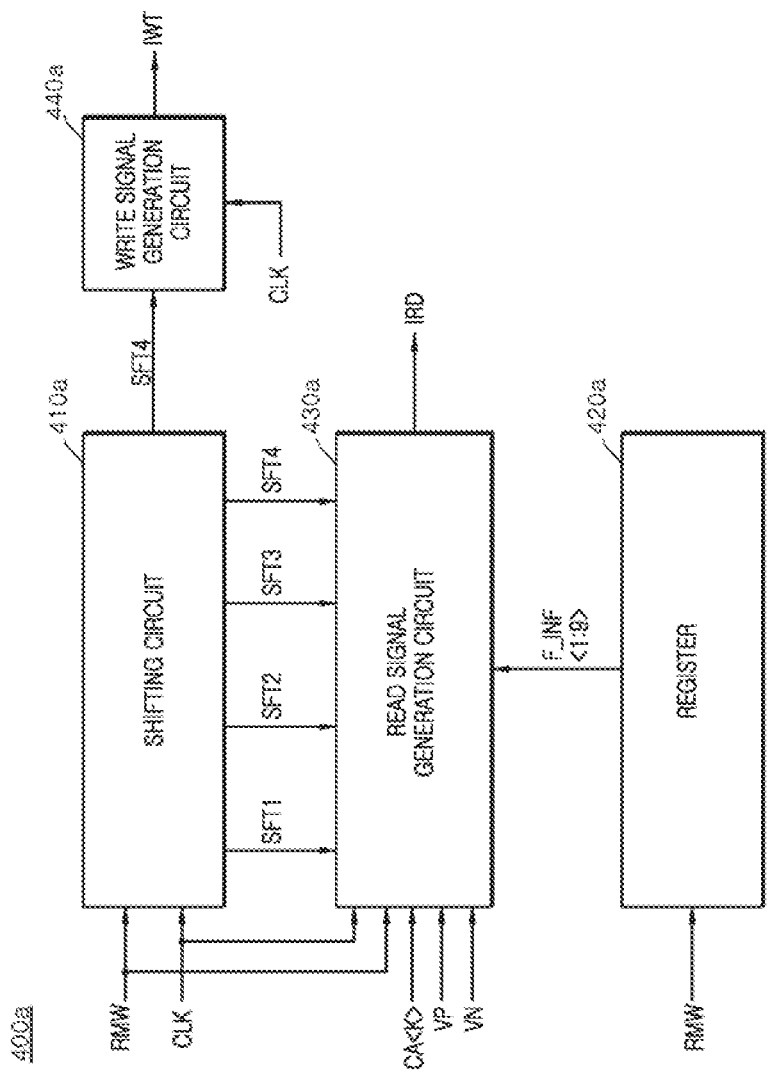
FIG. 22 is a block diagram illustrating a configuration of a read/write control circuit included in the semiconductor device illustrated in FIG. 16.

FIG. 22 is a block diagram illustrating a configuration of the read/write control circuit 400a. As illustrated in FIG. 22, the read/write control circuit 400a may include a shifting circuit 410a, a register 420a, a read signal generation circuit 430a, and a write signal generation circuit 440a.

The shifting circuit 410a illustrated in FIG. 22 may be realized using substantially the same circuit as the shifting circuit 310 illustrated in FIGS. 3 and 5. Thus, because the shifting circuit 410a performs the same operation as the shifting circuit 310, detailed descriptions of the shifting circuit 410a will be omitted hereinafter. The shifting circuit 410a illustrated in FIG. 22 may be replaced with the shifting circuit 310 illustrated in FIGS. 3 and 5.

The register 420a illustrated in FIG. 22 may be realized using substantially the same circuit as the register 320 illustrated in FIG. 3. Thus, because the register 420a performs the same operation as the register 320, detailed descriptions of the register 420a will be omitted hereinafter. The register 420a illustrated in FIG. 22 may be replaced with the register 320 illustrated in FIG. 3.

The read signal generation circuit 430a may be synchronized with the clock signal CLK to generate the internal read signal IRD from first to fourth shifted signals SFT1, SFT2, SFT3, and SFT4 based on a delay time which is set by the read-modify-write command RMW, a write set signal CA<K>, the first supply voltage VP, the second supply voltage VN, and first to ninth frequency information signals F_INF<1:9>. The delay time set by the read signal generation circuit 430a may be determined as a sum of a first delay time and a second delay time. The first delay time and the second delay time may be the same as the first delay time and the second delay time described with reference to FIG. 13. The write set signal CA<K> may correspond to a $K^{th}$ bit signal of command/address signal CA<1:K>. The write set signal CA<K> may have a logic "high" level to perform the read-modify-write operation.

The write signal generation circuit 440a illustrated in FIG. 22 may be realized using substantially the same circuit as the write signal generation circuit 340 illustrated in FIG. 3. Thus, because the write signal generation circuit 440a performs the same operation as the write signal generation circuit 340, detailed descriptions of the write signal generation circuit 440a will be omitted hereinafter. The write signal generation circuit 440a illustrated in FIG. 22 may be replaced with the write signal generation circuit 340 illustrated in FIG. 3.

Figure 23:
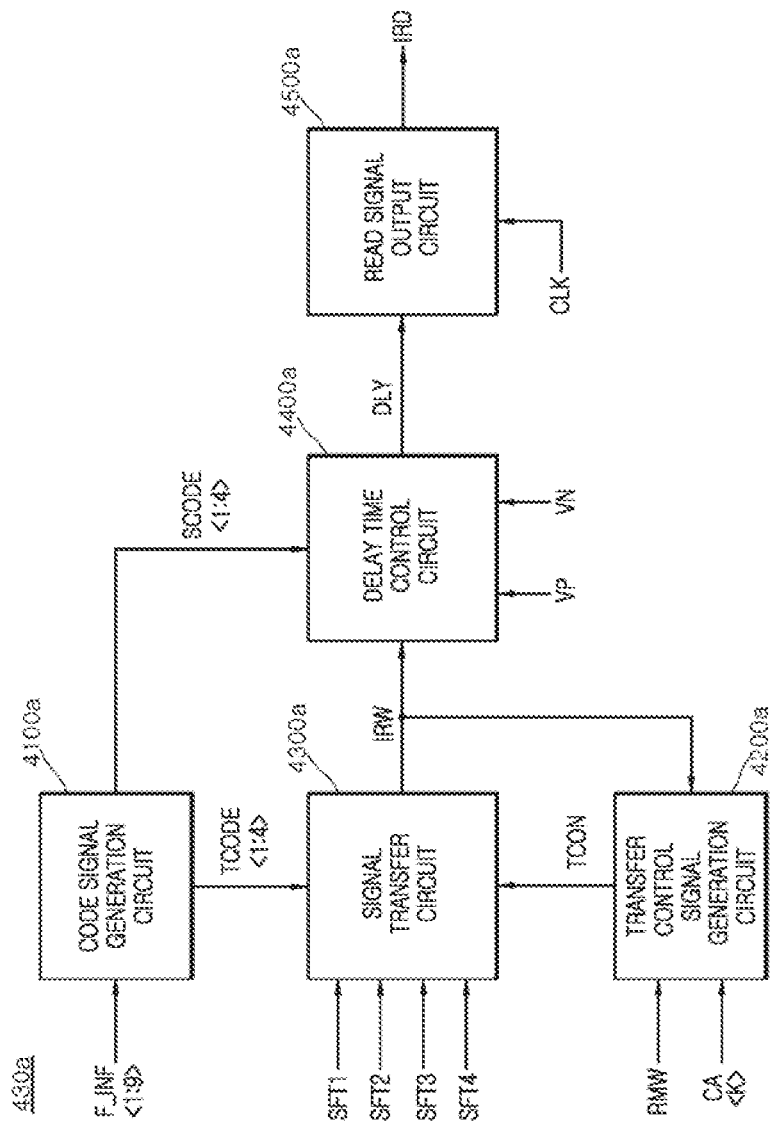
FIG. 23 is a block diagram illustrating a configuration of a read signal generation circuit included in the read/write control circuit illustrated in FIG. 22.

FIG. 23 is a block diagram illustrating a configuration of the read signal generation circuit 430a. As illustrated in FIG. 23, the read signal generation circuit 430a may include a code signal generation circuit 4100a, a transfer control signal generation circuit 4200a, a signal transfer circuit 4300a, a delay time control circuit 4400a, and a read signal output circuit 4500a.

The code signal generation circuit 4100a illustrated in FIG. 23 may be realized using substantially the same circuit as the code signal generation circuit 3100 illustrated in FIGS. 6 to 9. Thus, because the code signal generation circuit 4100a performs the same operation as the code signal generation circuit 3100, detailed descriptions of the code signal generation circuit 4100a will be omitted hereinafter. The code signal generation circuit 4100a illustrated in FIG. 23 may be replaced with the code signal generation circuit 3100 illustrated in FIGS. 6 to 9.

The transfer control signal generation circuit 4200a illustrated in FIG. 23 may be realized using substantially the same circuit as the transfer control signal generation circuit 3200 illustrated in FIGS. 6, 10, and 11. Thus, because the transfer control signal generation circuit 4200a performs the same operation as the transfer control signal generation circuit 3200, detailed descriptions of the transfer control signal generation circuit 4200a will be omitted hereinafter. The transfer control signal generation circuit 4200a illustrated in FIG. 23 may be replaced with the transfer control signal generation circuit 3200 illustrated in FIGS. 6, 10, and 11.

The signal transfer circuit 4300a illustrated in FIG. 23 may be realized using substantially the same circuit as the signal transfer circuit 3300 illustrated in FIGS. 6 and 12. Thus, because the signal transfer circuit 4300a performs the same operation as the signal transfer circuit 3300, detailed descriptions of the signal transfer circuit 4300a will be omitted hereinafter. The signal transfer circuit 4300a illustrated in FIG. 23 may be replaced with the signal transfer circuit 3300 illustrated in FIGS. 6 and 12.

The delay time control circuit 4400a may delay an internal read/write signal IRW by a delay time, which is set by the first supply voltage VP, the second supply voltage VN, and first to fourth speed code signals SCODE<1:4>, to generate a delay signal DLY.

The read signal output circuit 4500a illustrated in FIG. 23 may be realized using substantially the same circuit as the read signal output circuit 3500 illustrated in FIG. 6. Thus, because the read signal output circuit 4500a performs the same operation as the read signal output circuit 3500, detailed descriptions of the read signal output circuit 4500a will be omitted hereinafter. The read signal output circuit 4500a illustrated in FIG. 23 may be replaced with the read signal output circuit 3500 illustrated in FIG. 6.

Figure 24:
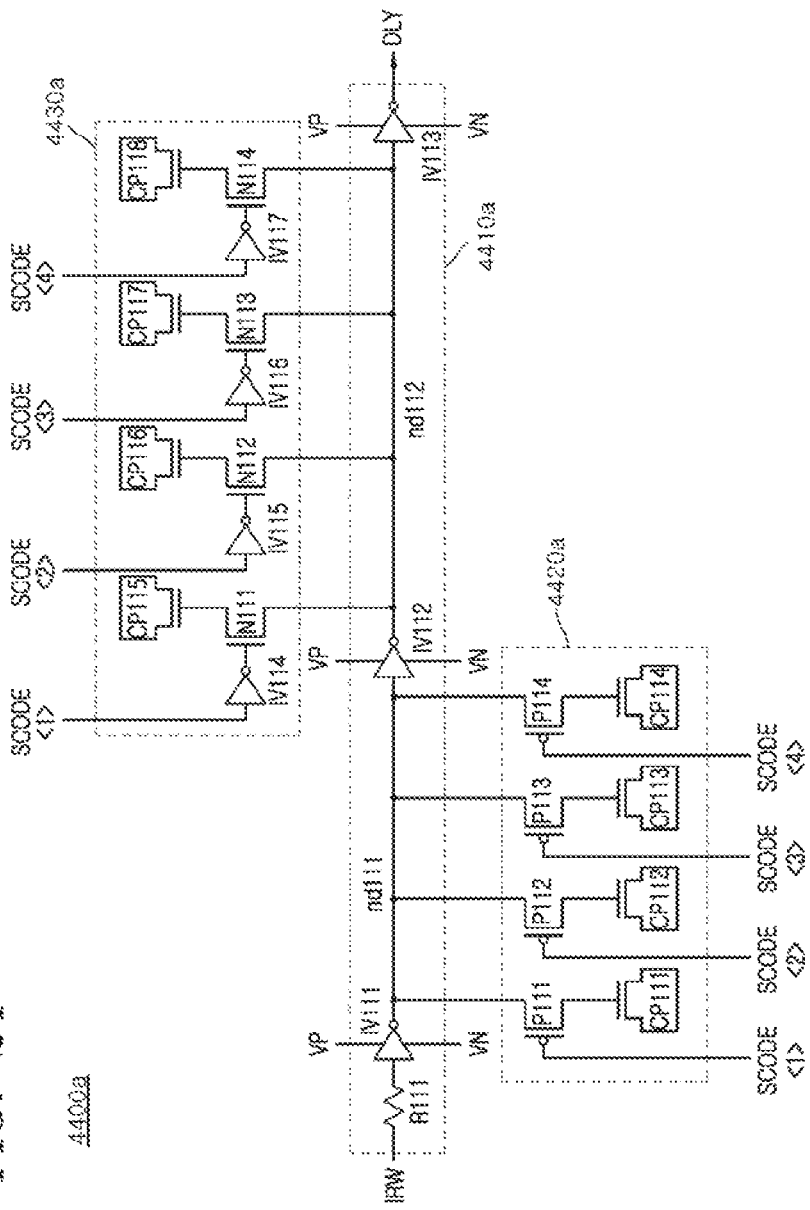
FIG. 24 is a circuit diagram illustrating a configuration of a delay time control circuit included in the read signal generation circuit illustrated in FIG. 23.

FIG. 24 is a circuit diagram illustrating a configuration of the delay time control circuit 4400a. As illustrated in FIG. 24, the delay time control circuit 4400a may include a delay path 4410a, a first delay time control circuit 4420a, and a second delay time control circuit 4430a.

The delay path 4410a may be a path including a resistor R111 and inverters IV111, IV112, and IV113 which are connected in series.

The internal read/write signal IRW may be inputted to one terminal of the resistor R111, and the other terminal of the resistor R111 may be coupled to an input terminal of the inverter IV111.

The inverter IV111 may inversely delay the internal read/write signal IRW, which is inputted through the resistor R111, by a delay time set by the first supply voltage VP and the second supply voltage VN to output the inversely delayed signal of the internal read/write signal IRW to a node nd111.

The inverter IV112 may inversely delay a signal of the node nd111 by a delay time set by the first supply voltage VP and the second supply voltage VN to output the inversely delayed signal of the signal of the node nd111 to a node nd112.

The inverter IV113 may inversely delay a signal of the node nd112 by a delay time set by the first supply voltage VP and the second supply voltage VN to output the inversely delayed signal of the signal of the node nd112 as the delay signal DLY.

The delay times of the inverters IV111, IV112, and IV113 may be reduced when a voltage difference between the first supply voltage VP and the second supply voltage VN increases. In contrast, the delay times of the inverters IV111, IV112, and IV113 may increase when a voltage difference between the first supply voltage VP and the second supply voltage VN is reduced. The first supply voltage VP may be applied to source terminals of PMOS transistors included in the inverters IV111, IV112, and IV113. The second supply voltage VN may be applied to source terminals of NMOS transistors included in the inverters IV111, IV112, and IV113.

A total delay time of the inverters IV111, IV112, and IV113 connected in series may be adjusted by the first supply voltage VP and the second supply voltage VN, and the delay path 4410a may delay the internal read/write signal IRW by the total delay time determined by the inverters IV111, IV112, and IV113 to generate the delay signal DLY.

The first delay time control circuit 4420a may be realized using PMOS transistors P111, P112, P113, and P114 and capacitors CP111, CP112, CP113, and CP114.

The PMOS transistor P111 may be coupled between the node nd111 and the capacitor CP111 and may be turned on when the first speed code signal SCODE<1> has a logic "low" level. The PMOS transistor P112 may be coupled between the node nd111 and the capacitor CP112 and may be turned on when the second speed code signal SCODE<2> has a logic "low" level. The PMOS transistor P113 may be coupled between the node nd111 and the capacitor CP113 and may be turned on when the third speed code signal SCODE<3> has a logic "low" level. The PMOS transistor P114 may be coupled between the node nd111 and the capacitor CP114 and may be turned on when the fourth speed code signal SCODE<4> has a logic "low" level.

The first delay time control circuit 4420a may be connected to the node nd111 and may control an amount of charges at the node nd111 based on the first to fourth speed code signals SCODE<1:4> to adjust a delay time of the first delay time control circuit 4420a. The first delay time control circuit 4420a may control electrical connection between the node nd111 and the capacitors CP111-CP114 according to the number of signals enabled to have a logic "low" level among the first to fourth speed code signals SCODE<1:4>. The first delay time control circuit 4420a may increase an amount of charges at the node nd111 to increase a delay time of the first delay time control circuit 4420a when the number of capacitors electrically connected to the node nd111 among the capacitors CP111-CP114 increases. The first delay time control circuit 4420a may reduce an amount of charges at the node nd111 to reduce a delay time of the first delay time control circuit 4420a when the number of capacitors electrically connected to the node nd111 among the capacitors CP111-CP114 is reduced.

The second delay time control circuit 4430a may be realized using inverters IV114, IV115, IV116, and IV117, NMOS transistors N111, N112, N113, and N114, and capacitors CP115, CP116, CP117, and CP118.

The inverter IV114 may inversely buffer the first speed code signal SCODE<1> to output the inversely buffered signal of the first speed code signal SCODE<1>. The inverter IV115 may inversely buffer the second speed code signal SCODE<2> to output the inversely buffered signal of the second speed code signal SCODE<2>. The inverter IV116 may inversely buffer the third speed code signal SCODE<3> to output the inversely buffered signal of the third speed code signal SCODE<3>. The inverter IV117 may inversely buffer the fourth speed code signal SCODE<4> to output the inversely buffered signal of the fourth speed code signal SCODE<4>.

The NMOS transistor N111 may be coupled between the node nd112 and the capacitor CP115 and may be turned on when an output signal of the inverter IV114 has a logic "high" level. The NMOS transistor N112 may be coupled between the node nd112 and the capacitor CP116 and may be turned on when an output signal of the inverter IV115 has a logic "high" level. The NMOS transistor N113 may be coupled between the node nd112 and the capacitor CP117 and may be turned on when an output signal of the inverter IV116 has a logic "high" level. The NMOS transistor N114 may be coupled between the node nd112 and the capacitor CP118 and may be turned on when an output signal of the inverter IV117 has a logic "high" level.

The second delay time control circuit 4430a may be connected to the node nd112 and may control an amount of charges at the node nd112 based on the first to fourth speed code signals SCODE<1:4> to adjust a delay time of the second delay time control circuit 4430*a*. The second delay time control circuit 4430*a* may control electrical connection between the node nd112 and the capacitors CP115-CP118 according to the number of signals enabled to have a logic "low" level among the first to fourth speed code signals SCODE<1:4>. The second delay time control circuit 4430*a* may increase an amount of charges at the node nd112 to increase a delay time of the second delay time control circuit 4430*a* when the number of capacitors electrically connected to the node nd112 among the capacitors CP115-CP118 increases. The second delay time control circuit 4430*a* may reduce an amount of charges at the node nd112 to reduce a delay time of the second delay time control circuit 4430*a* when the number of capacitors electrically connected to the node nd112 among the capacitors CP115-CP118 is reduced.

As described above, a system for performing a read-modify-write operation according to another embodiment may adjust a point in time when an internal read operation is performed and a point in time when an internal write operation is performed according to an internal delay time and a frequency of a clock signal. The system for performing the read-modify-write operation may adjust the point in time when the internal read operation is performed and the point in time when the internal write operation is performed according to the internal delay time and a frequency of the clock signal, thereby uniformly adjusting a period between the internal read operation and the internal write operation.

Figure 25:
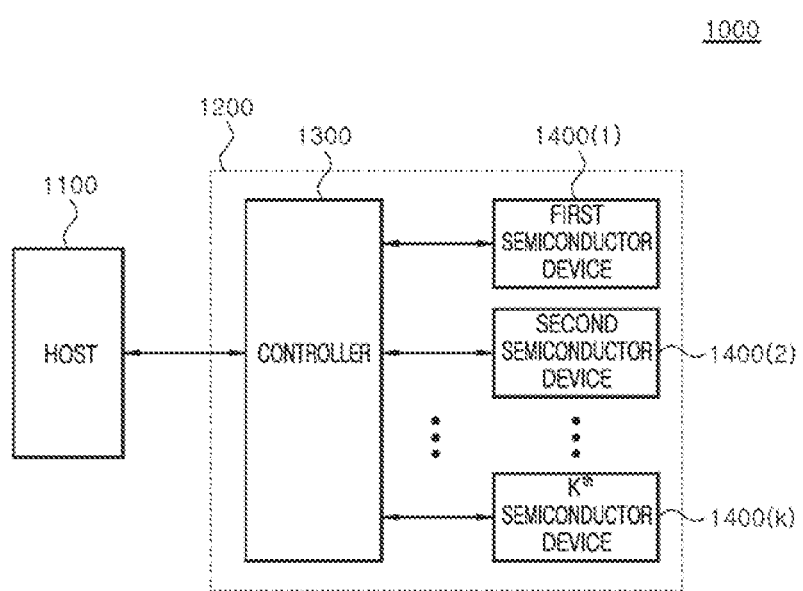
FIG. 25 is a block diagram illustrating a configuration of an electronic system employing at least one of the systems illustrate in FIGS. 1 to 24.

FIG. 25 is a block diagram illustrating a configuration of an electronic system 1000 according to an embodiment of the present disclosure. As illustrated in FIG. 25, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform the read-modify-write operation. Each of the semiconductor devices 1400(K:1) may adjust a point in time when an internal read operation is performed and a point in time when an internal write operation is performed according to an internal delay time and a frequency of a clock signal. Each of the semiconductor devices 1400(K:1) may also adjust the point in time when the internal read operation is performed and the point in time when the internal write operation is performed according to the internal delay time and a frequency of the clock signal, thereby uniformly adjusting a period between the internal read operation and the internal write operation.

The controller 1300 may be realized using the controller illustrated in FIG. 1 or the controller 10*a* illustrated in FIG. 15. Each of the semiconductor devices 1400(K:1) may be realized using the semiconductor device 20 illustrated in FIG. 1 or the semiconductor device 20*a* illustrated in FIG. 15. In some embodiments, each of the semiconductor devices 1400(K:1) may be realized using one of a dynamic random access memory (DRAM), a phase change random access memory (PRAM), a resistive random access memory (RRAM), a magnetic random access memory (MRAM), and a ferroelectric random access memory (FRAM).

What is claimed is:

1. A semiconductor memory device comprising:
a read and write (read/write) control circuit configured to generate an internal write signal after generating an internal read signal from one of a plurality of shifted signals which are generated by shifting a read-modify-write command according to a frequency of a clock signal;
a core circuit configured to output read data stored in the core circuit based on the internal read signal and an internal address during an internal read operation of a read-modify-write operation; and
an error correction circuit configured to correct an error included in internal data by performing a logical operation on the read data, output based on the internal read signal, with the internal data to generate write data,
wherein the internal read signal is enabled by a write set signal during the read-modify-write operation, and
wherein the write set signal is a signal generated from any one of bits included in a command and address (command/address) signal.

2. The semiconductor memory device of claim 1, wherein the write set signal is input through the command and address (command/address) signal.

3. The semiconductor memory device of claim 1,
wherein the internal read signal is generated by delaying the read-modify-write command by a first delay time when a frequency of the clock signal is a first frequency; and
wherein the internal read signal is generated by delaying the read-modify-write command by a second delay time when a frequency of the clock signal is a second frequency which is greater than the first frequency.

4. The semiconductor memory device of claim 3, wherein the first delay time is set to be greater than the second delay time.

5. The semiconductor memory device of claim 1, wherein the internal write signal is generated by delaying the read-modify-write command by a third delay time.

6. The semiconductor memory device of claim 1,
wherein the plurality of shifted signals include first to third shifted signals; and
wherein the read/write control circuit includes:
a shifting circuit configured to shift the read-modify-write command in synchronization with the clock signal to generate the first to third shifted signals which are sequentially enabled;
a register configured to generate frequency information signals including frequency information of the clock signal when the read-modify-write command is enabled;
a read signal generation circuit configured to be synchronized with the clock signal to generate the internal read signal from the first to third shifted signals based on a delay time which is set by the read-modify-write command, the write set signal, and the frequency information signals; and
a write signal generation circuit configured to delay the third shifted signal in synchronization with the clock signal to generate the internal write signal.

7. The semiconductor memory device of claim 6, wherein the read signal generation circuit includes:

a code signal generation circuit configured to generate a transfer code signal and a speed code signal based on the frequency information signals;
a transfer control signal generation circuit configured to generate a transfer control signal from the write set signal when the read-modify-write command is enabled;
a signal transfer circuit configured to output one of the first to third shifted signals as an internal read/write signal based on the transfer code signal when the transfer control signal is enabled;
a delay time control circuit configured to delay the internal read/write signal by a delay time, which is set by the speed code signal, to generate a delay signal; and
a read signal output circuit configured to delay the delay signal in synchronization with the clock signal to generate the internal read signal.

8. The semiconductor memory device of claim 7,
wherein the transfer code signal includes information on a frequency period of the clock signal; and
wherein the speed code signal includes information on an operation speed period in the frequency period of the clock signal.

9. The semiconductor memory device of claim 7, wherein the transfer control signal generation circuit includes:
an input control signal generation circuit configured to generate an input control signal which is enabled when the read-modify-write command is enabled;
an output control signal generation circuit configured to generate an output control signal which is enabled when the internal read/write signal is enabled; and
a pipe circuit configured to latch the write set signal when the input control signal is enabled and configured to output the latched write set signal as the transfer control signal when the output control signal is enabled.

10. The semiconductor memory device of claim 7, wherein the signal transfer circuit includes:
a selection transfer circuit configured to output one of the first to third shifted signals as a transferred shift signal based on the transfer code signal; and
an internal read/write signal generation circuit configured to buffer the transferred shift signal in synchronization with the clock signal to generate the internal read/write signal while the transfer control signal is enabled.

11. The semiconductor memory device of claim 7, wherein the delay time control circuit includes:
a first delay time control circuit connected to a first node to which the internal read/write signal is inputted and configured to control an amount of charges at the first node based on the speed code signal to adjust a delay time of the first delay time control circuit;
a buffer configured to inversely buffer a signal of the first node to output the inversely buffered signal of the signal of the first node to a second node; and
a second delay time control circuit connected to the second node and configured to control an amount of charges at the second node based on the speed code signal to adjust a delay time of the second delay time control circuit.

12. A semiconductor memory device comprising:
a voltage control circuit configured to generate a first supply voltage and a second supply voltage having voltage levels that are adjusted according to an internal delay time;
a read and write (read/write) control circuit configured to generate an internal write signal after generating an internal read signal from a read-modify-write command based on a delay time which is adjusted according to a frequency of a clock signal, the first supply voltage, and the second supply voltage;
a core circuit configured to output read data stored in the core circuit based on the internal read signal and an internal address during an internal read operation of a read-modify-write operation; and
an error correction circuit configured to correct an error included in internal data by performing a logical operation on the read data, output based on the internal read signal, with the internal data to generate write data.

13. The semiconductor memory device of claim 12, wherein the first supply voltage and the second supply voltage are supplied to a plurality of inverters included in a delay path of the read/write control circuit for adjusting the delay time.

14. The semiconductor memory device of claim 12, wherein when a voltage difference between the first supply voltage and the second supply voltage is reduced, the internal delay time increases.

15. The semiconductor memory device of claim 12,
wherein the internal read signal is generated by delaying the read-modify-write command by a first delay time when a frequency of the clock signal is a first frequency; and
wherein the internal read signal is generated by delaying the read-modify-write command by a second delay time when a frequency of the clock signal is a second frequency which is greater than the first frequency.

16. The semiconductor memory device of claim 12, wherein the internal write signal is generated by delaying the read-modify-write command by a third delay time.

17. The semiconductor memory device of claim 12, wherein the voltage control circuit includes:
a pulse signal generation circuit configured to generate a pulse signal including a pulse which is generated in synchronization with a rising edge of the clock signal;
a voltage code signal generation circuit configured to detect a delay period of the pulse signal in synchronization with the clock signal to generate a voltage code signal; and
a voltage control circuit configured to generate the first supply voltage and the second supply voltage having voltage levels that are controlled according to a logic level combination of the voltage code signal.

18. The semiconductor memory device of claim 17, wherein the voltage code signal generation circuit includes:
a pulse delay signal generation circuit including a plurality of delay circuits and configured to delay the pulse signal to generate a plurality of pulse delay signals which are sequentially enabled;
a pulse latch signal generation circuit configured to latch the plurality of pulse delay signals in synchronization with the clock signal to generate a plurality of pulse latch signals; and
an encoder configured to encode the plurality of pulse latch signals to generate the voltage code signal.

19. The semiconductor memory device of claim 17, wherein the voltage control circuit includes:
a first voltage generation circuit configured to generate the first supply voltage from a high voltage, which is greater than a power source voltage, according to a logic level combination of the voltage code signal; and
a second voltage generation circuit configured to generate the second supply voltage from the power source voltage according to a logic level combination of the voltage code signal.

20. The semiconductor memory device of claim 12, wherein the read/write control circuit includes:
- a shifting circuit configured to shift the read-modify-write command in synchronization with the clock signal to generate first to third shifted signals which are sequentially enabled;
- a register configured to generate frequency information signals including frequency information of the clock signal when the read-modify-write command is enabled;
- a read signal generation circuit configured to be synchronized with the clock signal to generate the internal read signal from the first to third shifted signals based on a delay time which is set by the read-modify-write command, the write set signal, the first supply voltage, the second supply voltage, and the frequency information signals; and
- a write signal generation circuit configured to delay the third shifted signal in synchronization with the clock signal to generate the internal write signal.

21. The semiconductor memory device of claim 20, wherein the read signal generation circuit includes:
- a code signal generation circuit configured to generate a transfer code signal and a speed code signal based on the frequency information signals;
- a transfer control signal generation circuit configured to generate a transfer control signal from the write set signal when the read-modify-write command is enabled;
- a signal transfer circuit configured to output one of the first to third shifted signals as an internal read/write signal based on the transfer code signal when the transfer control signal is enabled;
- a delay time control circuit configured to delay the internal read/write signal by a delay time, which is set by the first supply voltage, the second supply voltage, and the speed code signal, to generate a delay signal; and
- a read signal output circuit configured to delay the delay signal in synchronization with the clock signal to generate the internal read signal.

22. The semiconductor memory device of claim 21, wherein the transfer code signal includes information on a frequency period of the clock signal; and wherein the speed code signal includes information on an operation speed period in the frequency period of the clock signal.

23. The semiconductor memory device of claim 21, wherein the transfer control signal generation circuit includes:
- an input control signal generation circuit configured to generate an input control signal which is enabled when the read-modify-write command is enabled;
- an output control signal generation circuit configured to generate an output control signal which is enabled when the internal read/write signal is enabled; and
- a pipe circuit configured to latch the write set signal when the input control signal is enabled and configured to output the latched write set signal as the transfer control signal when the output control signal is enabled.

24. The semiconductor memory device of claim 21, wherein the signal transfer circuit includes:
- a selection transfer circuit configured to output one of the first to third shifted signals as a transferred shift signal based on the transfer code signal; and
- an internal read/write signal generation circuit configured to buffer the transferred shift signal in synchronization with the clock signal to generate the internal read/write signal while the transfer control signal is enabled.

25. The semiconductor memory device of claim 21, wherein the delay time control circuit includes:
- a delay path including a plurality of inverters connected in series and configured to delay the internal read/write signal using the plurality of inverters, a total delay time of which is controlled by the first supply voltage and the second supply voltage, to generate the delay signal;
- a first delay time control circuit connected to a first node included in the delay path and configured to control an amount of charges at the first node based on the speed code signal to adjust a delay time of the first delay time control circuit; and
- a second delay time control circuit connected to a second node included in the delay path and configured to control an amount of charges at the second node based on the speed code signal to adjust a delay time of the second delay time control circuit.

\* \* \* \* \*